(12) United States Patent
Matsuno

(10) Patent No.: US 8,421,477 B2
(45) Date of Patent: Apr. 16, 2013

(54) RESISTANCE VARIATION DETECTION CIRCUIT, SEMICONDUCTOR DEVICE AND RESISTANCE VARIATION DETECTION METHOD

(75) Inventor: Noriaki Matsuno, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 252 days.

(21) Appl. No.: 12/662,460

(22) Filed: Apr. 19, 2010

(65) Prior Publication Data

US 2010/0264943 A1    Oct. 21, 2010

(30) Foreign Application Priority Data

Apr. 20, 2009    (JP) .................................. 2009-102025

(51) Int. Cl.
*G01R 27/00*    (2006.01)
*G01R 27/08*    (2006.01)

(52) U.S. Cl.
USPC ............ 324/600; 324/691; 324/704; 324/705

(58) Field of Classification Search ........................ None
See application file for complete search history.

(56) References Cited

U.S. PATENT DOCUMENTS

| | | | | | |
|---|---|---|---|---|---|
| 3,377,555 | A | * | 4/1968 | Lewis | 324/601 |
| 5,717,323 | A | * | 2/1998 | Tailliet | 323/297 |
| 6,111,461 | A | * | 8/2000 | Matsuno | 330/132 |

FOREIGN PATENT DOCUMENTS

| | | |
|---|---|---|
| JP | 8-256034 | 10/1996 |
| JP | 2732323 | 12/1997 |

* cited by examiner

*Primary Examiner* — Vinh Nguyen
(74) *Attorney, Agent, or Firm* — McGinn IP Law Group, PLLC

(57) ABSTRACT

A circuit for detecting variation of a resistance value of a resistor with respect to a reference value includes a first resistor; a second resistor; a first current source circuit for supplying current to the first resistor; a second current source circuit for supplying current to the second resistor; a voltage comparator circuit for comparing a voltage across the first resistor and a voltage across the second resistor; and a control circuit for digitally adjusting the supply current of at least one of the first or second current source circuit. A ratio of resistance values of the first and second resistors can be obtained from an adjustment value from the control circuit and result of comparison from the voltage comparator circuit.

17 Claims, 23 Drawing Sheets

FIG. 22

RESISTANCE VARIATION DETECTION CIRCUIT, SEMICONDUCTOR DEVICE AND RESISTANCE VARIATION DETECTION METHOD

TECHNICAL FIELD

Cross-Reference to Related Application

This application is based upon and claims the benefit of the priority of Japanese patent application No. 2009-102025 filed on Apr. 20, 2009, the disclosure of which is incorporated herein in its entirety by reference thereto.

This invention relates to a resistance variation detection circuit, a semiconductor device having, this resistance variation circuit, and a resistance variation detection method. More particularly, the invention relates to a resistance variation detection circuit for detecting a variation in the resistance of a resistor, which is formed on a semiconductor substrate (on or above the substrate surface) of a semiconductor integrated circuit, with respect to a reference resistance value, a semiconductor device having this resistance variation circuit, and a resistance variation detection method.

BACKGROUND

Resistors are used in the analog circuit of semiconductor integrated circuit. Resistors used in a semiconductor integrated circuit are of various types, such as a diffusion resistor provided on the surface of a semiconductor substrate and a polycrystalline silicon resistor provided above the surface of a semiconductor substrate, but a variation in the resistance value of the resistance element occurs unavoidably in any case. When an analog integrated circuit is designed, therefore, it is necessary to presume beforehand that a certain degree of variation in resistance value will exist. One method of solving the problem of resistance-value variation is to integrate a circuit, which is for detecting the variation in resistance value, with the integrated circuit. By using this circuit, each chip itself evaluates the resistance variation of the chip and supplies the result to other circuit elements, whereby a suitable correction is applied for each individual element circuit. As a result, a decline or fluctuation in performance ascribable to a variation in resistance value can be suppressed, or it is possible to reduce excess current consumption for achieving operation margin even under worst-case conditions.

FIG. 1 of Patent Document 1 illustrates a circuit provided with a resistor network R(1) to R(N) that is dependent upon temperature variations and a reference resistor 105 that is independent of the temperature variations, wherein the resistance value of the resistor network is modified so that this resistance value will be maintained the same as that of the resistance value of the reference resistor. More specifically, resistors R(1) to R(N) that depend upon temperature variations are serially connected and N-number of taps are extracted from this series connection. By using a comparator 135 to find the position of a tap where the terminal voltage of the resistor 105 and potential are in balance, the amount of resistance variation can be determined.

FIG. 3 of Patent Document 2 illustrates a resistance error detection circuit in which current sources (11, 12) are formed in an IC for supplying identical currents to a first resistance element (RB) formed inside the IC and to a reference resistor (RS) provided outside the IC, and which is provided with a differential circuit 13 for outputting, as an analog voltage, the difference between the voltages of the first resistance element (RB) and reference resistor (RS) ascribable to the currents that flow through them.

[Patent Document 1] Japanese Patent Kokai Publication No. JP-A-08-256034, which corresponds to U.S. Pat. No. 5,717,323A.

[Patent Document 2] Japanese Patent Publication No. JP-2732323B

SUMMARY

The above patent documents are incorporated herein by reference thereto.

The analysis set forth below is given by the present invention. The technology disclosed in Patent Documents 1 and 2 involve several problems. With the method of changing over the position of the taps extracted from the serially connected resistors described in Patent Document 1, it is necessary to provide eight switch elements in order to perform variation detection equivalent to three bits, by way of example. The respective control signals are required as well. Accordingly, a drawback is that if the number of bits involved in variation detection is increased, the scale of the circuitry is enlarged owing to exponentiation of the number of bits. Further, with this arrangement, a small resistor having a resistance value equivalent to one LSB is required. In a case where a physically short resistance element is used because of this small resistor, resistors of both large and small physical dimensions are mixed within the chip. A problem is that this itself is a cause of variation anew.

In a case where all resistors are implemented by a series connection of the shortest resistors, more resistor contact areas become necessary in order to realize identical resistance values. Circuit area increases as a result. Further, with a decrease in the area of each individual resistance element, there is a commensurate decline in both the relative precision and absolute precision the resistance value. The decline in relative precision leads to a decline in the precision of resistance-value correction. The decline in absolute precision leads to a broader range of correction needed for dealing with resistance variations and, in turn, to an increase in circuit area.

Further, in a case where a small resistor is implemented by a parallel connection of resistors having large resistance values, circuit area increases. In particular, if the resistance value equivalent to one LSB is small, the required number of parallel connections of resistors increases exponentially. This has a major effect upon circuit area.

Further, with the resistance error detection circuit described in Patent Document 2, the variation information obtained is analog information, namely voltage. A drawback, therefore, is susceptibility to the influence of noise and the like when this information is transmitted to other blocks within the chip. Although it is possible to apply an A/D conversion to this variation information obtained in the form of voltage, the variation information typically requires an accuracy on the order of several millivolts to tens of millivolts. A drawback is that a high-precision, high-resolution A/D converter is necessary.

A resistance variation detection circuit according to one aspect of the present invention comprises: a first resistor; a second resistor; a first current source circuit that supplies current to the first resistor; a second current source circuit that supplies current to the second resistor; a voltage comparator circuit that compares a voltage across the first resistor and a voltage across the second resistor; and a control circuit that digitally adjusts the supply current of at least one of the first or second current source circuit. A ratio of resistance values of the first and second resistors can be obtained from an adjustment value from the control circuit and result of comparison from the voltage comparator circuit.

A semiconductor device according to another aspect of the present invention includes a semiconductor substrate on which the above-described resistance variation detection circuit is formed with the exception of either one of the first or second resistor. The semiconductor device comprises a terminal for an external resistor which is not formed on the semiconductor substrate.

A resistance variation detection method according to yet another aspect of the present invention comprising: providing a measurement circuit including: a first resistor; a second resistor; a first current source circuit that supplies current to the first resistor; a second current source circuit that supplies current to the second resistor; and a plurality of switches that digitally adjusts the supply current of at least one of the first or second current source circuit. The method further comprising: presetting the plurality of switches and supplying currents to the first and second resistors from the first and second current sources based on setting of the switches. The method further comprising: comparing a voltage across the first resistor and a voltage across the second resistor; changing the setting of the plurality of switches and repeating the comparison in case of necessity; and detecting a ratio of resistance values of the first and second resistors based on the setup of the switches and the comparison result.

The meritorious effects of the present invention are summarized as follows.

In accordance with the present invention, the amount of current supplied by at least one current source circuit is digitally adjusted and the ratio of resistance values of the first and second resistors can be obtained from the adjustment value and result of comparison from the voltage comparator circuit. Accordingly, resistance-element variation information can be obtained with a smaller circuit area.

Other features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

FIG. 22 is a block diagram of a resistance variation detection circuit according to a 17th example of the present invention.

PREFERRED MODES

Figure 1:
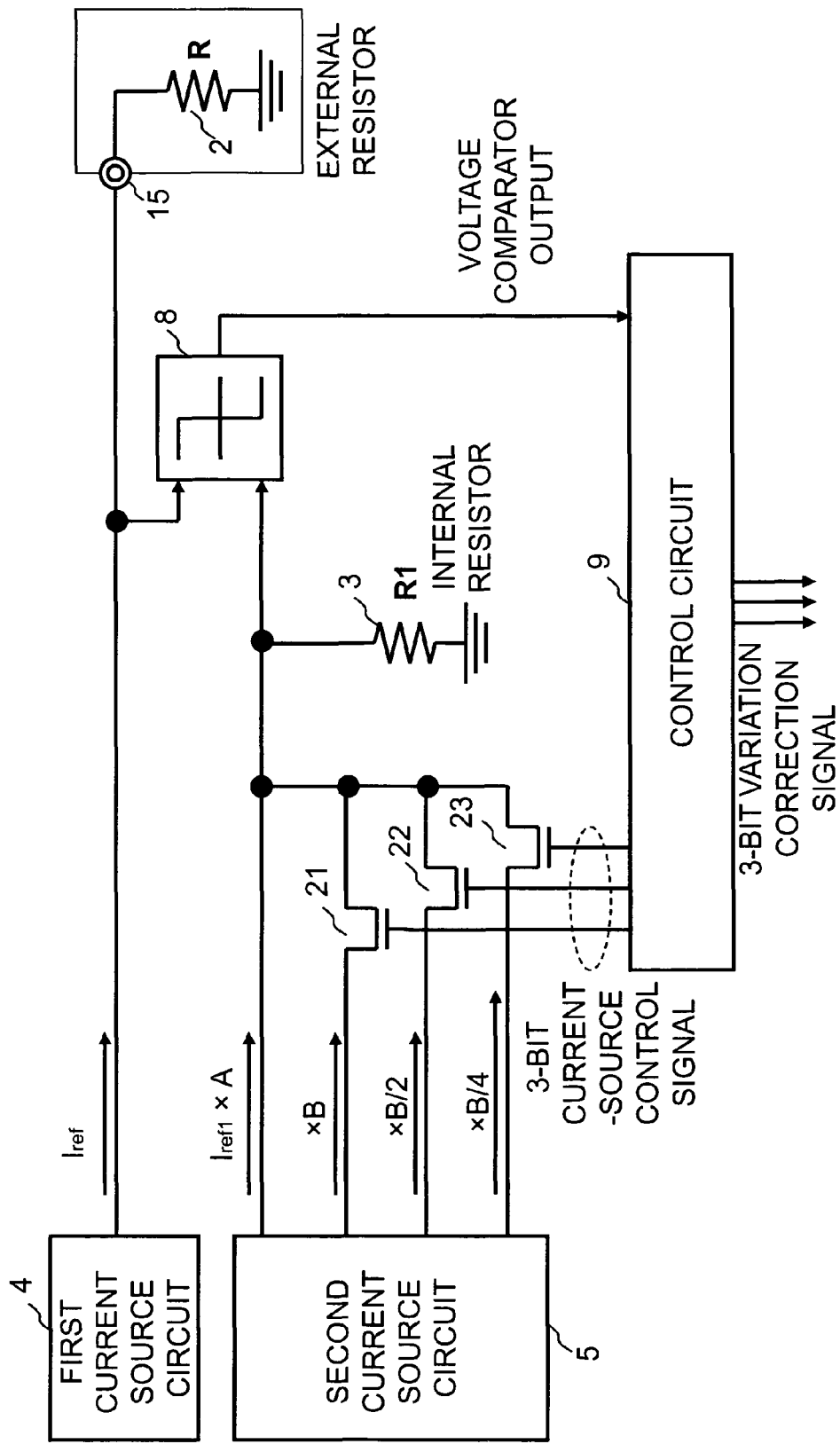
FIG. 1 is a block diagram of a resistance variation detection circuit according to a first example of the present invention.

An overview of examples of the present invention will be described with reference to the drawings as necessary. It should be noted that the drawings and reference characters in the drawings cited in the description of the examples indicate one example thereof and variations of the examples according to the present invention are not limited thereby.

As illustrated in FIGS. 1, 3, 5, 9 to 20, 22 and 23, a resistance variation detection circuit 1 according to the present invention comprises a first resistor 2; a second resistor 3; a first current source circuit 4 for supplying current to the first resistor 2; a second current source circuit 5 for supplying current to the second resistor 3; a voltage comparator circuit 8 for comparing a voltage across the first resistor 2 and a voltage across the second resistor 3; and a control circuit 9 for digitally adjusting the supply current of at least one of the first or second current source circuit 4, 5. The ratio between the resistance value of the first resistor 2 and the resistance value of the second resistor 3 can be obtained from an adjustment value from the control circuit 9 and result of comparison from the voltage comparator circuit 8. In a case where the resistance variation detection circuit 1 is incorporated in a semiconductor device, the relative precision between the current source circuits 4 and 5 can be realized comparatively easily but it is difficult to maintain the absolute precision of a resistance value. In accordance with the arrangement described above, either one of the first or second resistor 2, 3 is a highly precise resistor such as an external resistor, and the values of the currents that flow into the first or second resistor 2, 3 is varied, thereby making it possible to obtain the ratio of a relative resistance value of the internal resistance value to the resistance value of the highly precise (reference) resistor.

Further, by comparing the voltages across two resistors while controlling the currents of the current sources, the ratio between the resistance values of the two resistors can be estimated. If the value of the one of the two resistors is known, then the absolute value of the other resistance value can be ascertained. That is, a variation can be obtained.

Further, currents can be easily added. That is, it is possible for current values to be controlled using binary data by providing one current source for setting an offset current, providing a plurality of binarily weighted current sources that can be turned on and off, suitably selecting which of the plurality of current sources are turned on and off, and adding the selected currents. Accordingly, a variation in the resistance of a resistor can be obtained with a $2^n$-resolution using n+1 current sources and switches, and the variation can be acquired and distributed as digital data.

Furthermore, in comparison with the method of Patent Document 1, namely the method of detecting a variation in a resistance value using a string of resistors, the method of the present invention is advantageous in circuit area. More specifically, in order to obtain variation data having, e.g., 8-resolution, eight resistor taps are required with the method using the string of resistors. Consequently, eight switch elements and eight digital signal lines for controlling these switch elements are necessary. By contrast, in the present invention, binary-weighted three current sources need only be controlled. The higher the resolution, i.e., the greater the number of bits, the more this advantage becomes.

A further advantage is that, unlike the method of detection using a resistor string, a single on-chip reference resistor suffices. Since only one suffices, the on-chip reference resistor can be constructed by a resistance element with a typical size used in integrated circuits, or by a series-parallel connection thereof. As a result, the problems relating to resistance-value precision and circuit area in the method using a resistor string do not arise.

Further, as illustrated in FIGS. 1 to 20, 22 and 23 (particularly FIGS. 1 to 8), the resistance variation detection circuit 1 of the present invention is such that the control circuit 9 reads in the result of the comparison performed by the voltage comparator circuit 8, adjusts the current supply amount based upon the result of the comparison and outputs the final detection result as digital data. The digital data obtained as the detection result is supplied to other element circuits as a variation correction signal and can be used in suitably correcting the operating state of every element circuit. As a result, a decline or fluctuation in performance ascribable to a variation in resistance value can be suppressed, or it is possible to reduce excess current consumption for achieving operation margin even under worst-case conditions.

For the purpose of comparison, let us consider a case where variation data is obtained as an analog voltage, as in Patent Document 2. It is necessary that this analog voltage should be distributed to other blocks. This leads to a decline in robustness to noise and inclusion of noise in the analog voltage data. By contrast, with the arrangement of the present invention, these problems do not arise because the signal for correcting for resistance-value variation is acquired as digital data.

Further, as illustrated in FIGS. 11 to 20, 22 and 23, the resistance variation detection circuit 1 of the present invention further comprises a temperature characteristic compensation element 10, and the voltage comparator circuit 8 has a first input terminal 13 and a second input terminal 14, wherein a summed voltage of a voltage across the temperature characteristic compensation element 10 and a voltage across the first resistor 2 is input to the first input terminal 13, and a voltage across the second resistor 3 is input to the second input terminal 14. A difference between the temperature characteristics of the first and second resistors 2, 3 can be compensated for by such an arrangement. Further, in order to compensate for the temperature characteristics of a circuit block except the resistance variation detection circuit 1, the resistance variation detection circuit 1 can be designed to have a some temperature characteristic by using the temperature characteristic compensation element 10. It should be noted that the temperature characteristic compensation element 10 can utilize an element, other than a diode, having a specific temperature characteristic, one example of which is a thermister.

Further, as illustrated in FIGS. 11 to 20, 22 and 23, the resistance variation detection circuit 1 of the present invention further comprises a diode 10, and the voltage comparator circuit 8 has a first input terminal 13 and a second input terminal 14, wherein a summed voltage of a voltage across the diode 10 and a voltage across the first resistor 2 is input to the first input terminal 13, and a voltage across the second resistor 3 is input to the second input terminal 14.

Further, as illustrated in FIGS. 11 to 15, the resistance variation detection circuit 1 of the present invention is such that the diode 10 is connected in series with the first resistor 2. If the diode 10 is connected in series with the first resistor 2, then a summed voltage of the voltage across the diode 10 and the voltage across the first resistor 2 will be input to the first input terminal 13.

Figure 16:
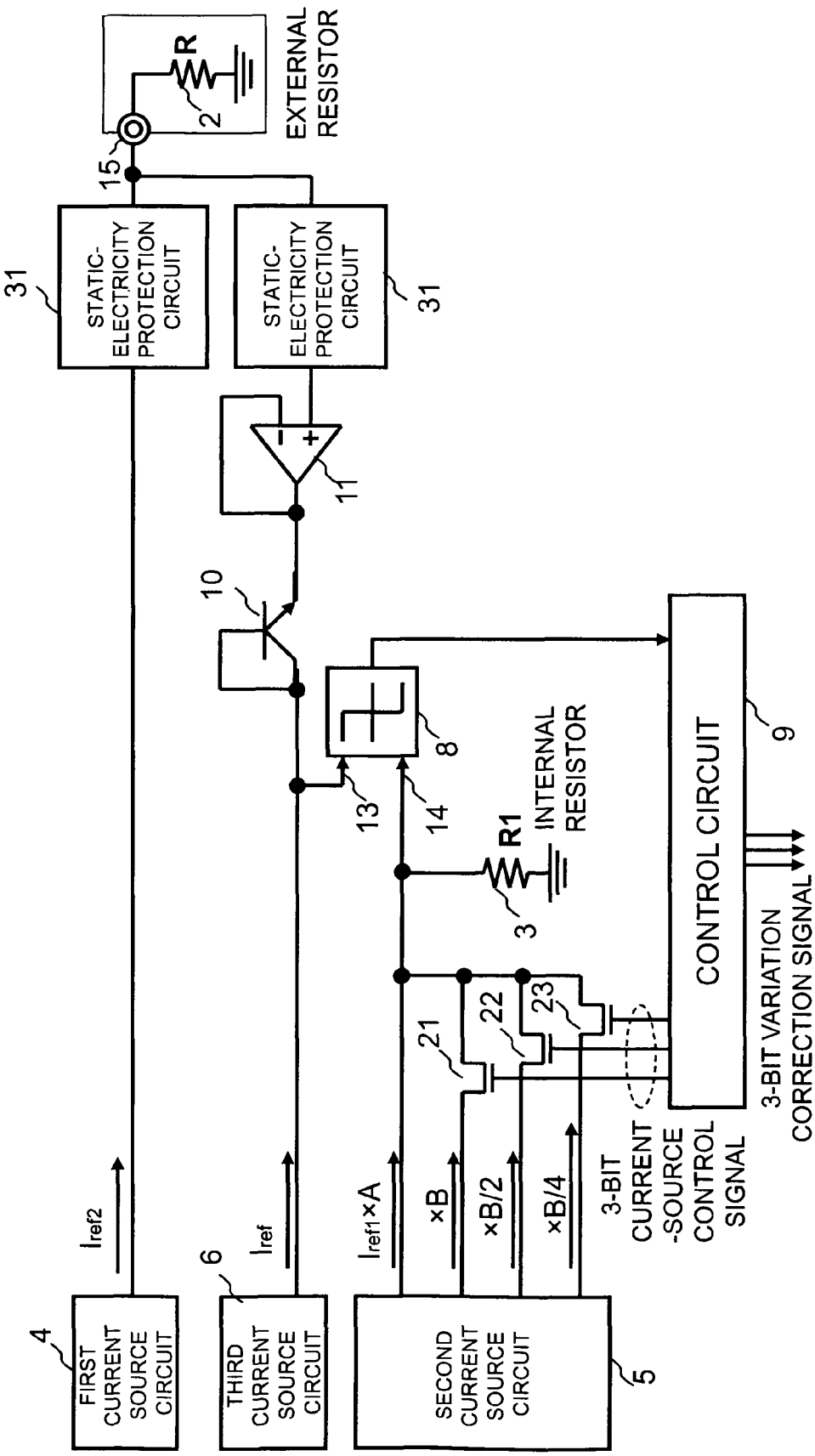
FIG. 16 is a block diagram of a resistance variation detection circuit according to an 11th example of the present invention.
Figure 17:
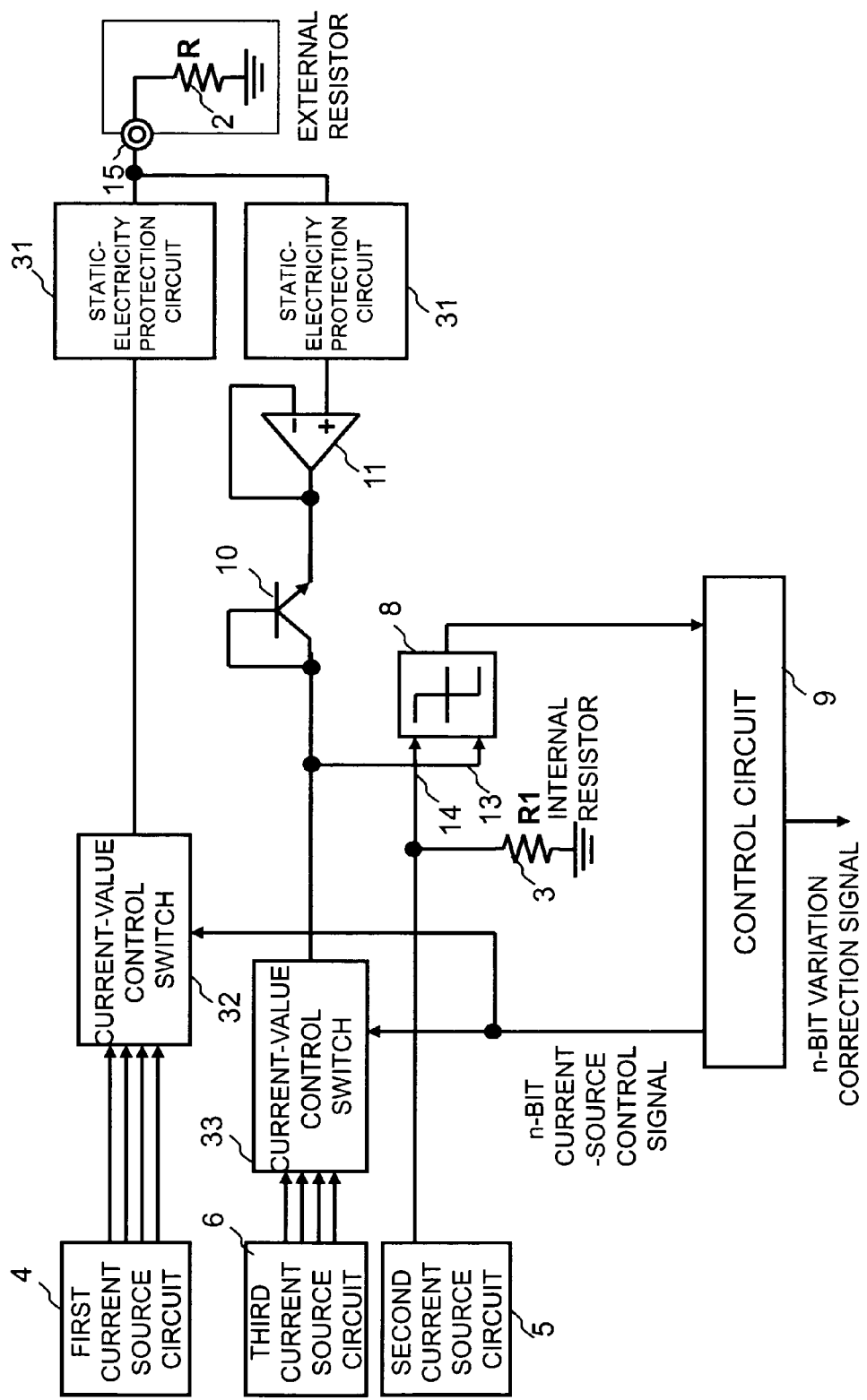
FIG. 17 is a block diagram of a resistance variation detection circuit according to a 12th example of the present invention.

Further, as illustrated in FIGS. 16 and 17, the resistance variation detection circuit 1 of the present invention further comprises a third current source circuit 6, which is connected to a first end of the diode 10 and to the first input terminal 13 of the voltage comparator circuit 8, for supplying current to the diode 10; and a voltage follower circuit 11 having an input connected to a first end of the first resistor 2 and an output connected to a second end of the diode 10. In accordance with this arrangement, the current that flows into the diode 10 can be supplied from a current source separate from the current source that supplies current to the first resistor 2.

Figure 18:
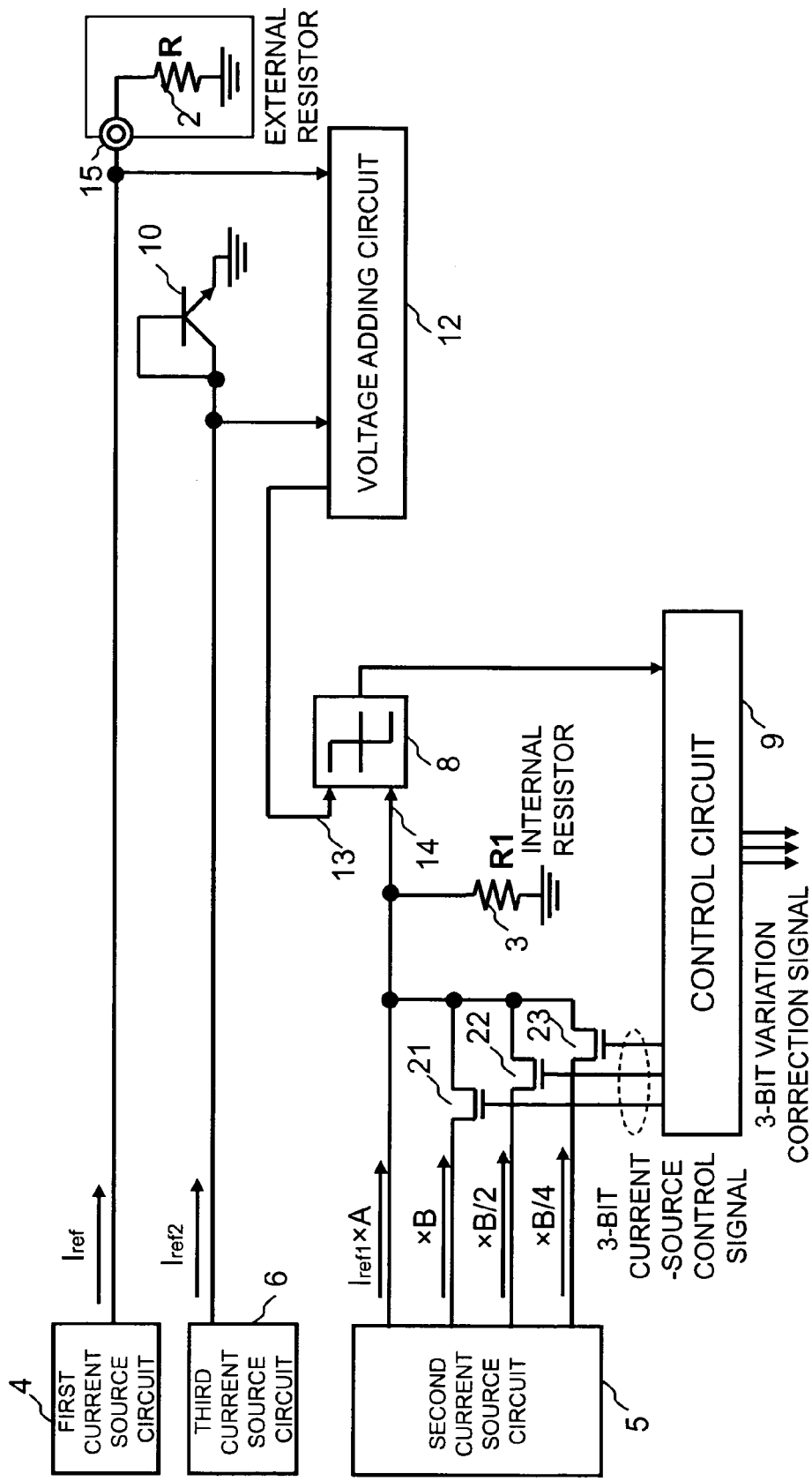
FIG. 18 is a block diagram of a resistance variation detection circuit according to a 13th example of the present invention.
Figure 19:
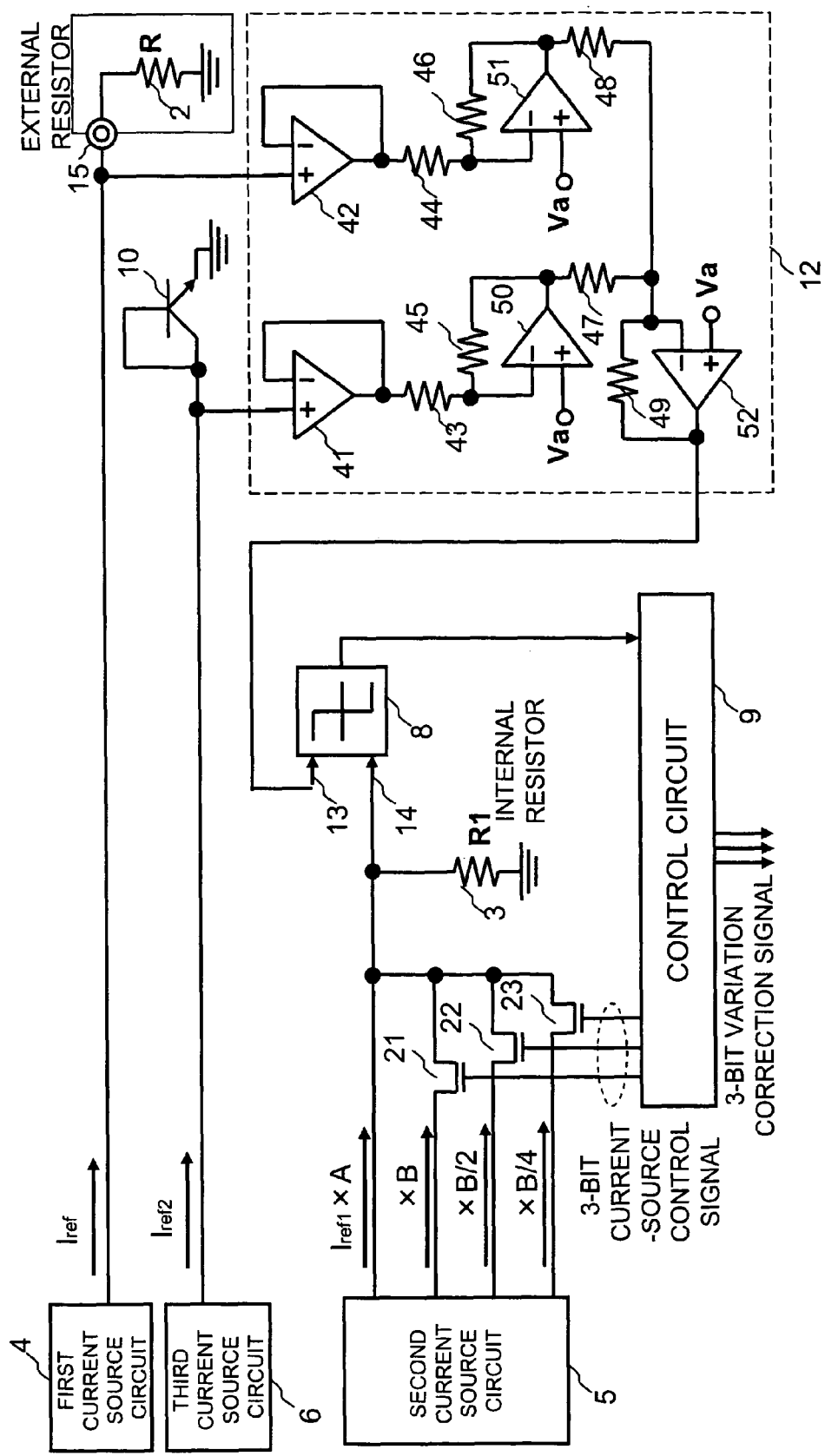
FIG. 19 is a block diagram of a resistance variation detection circuit according to a 14th example of the present invention.
Figure 20:
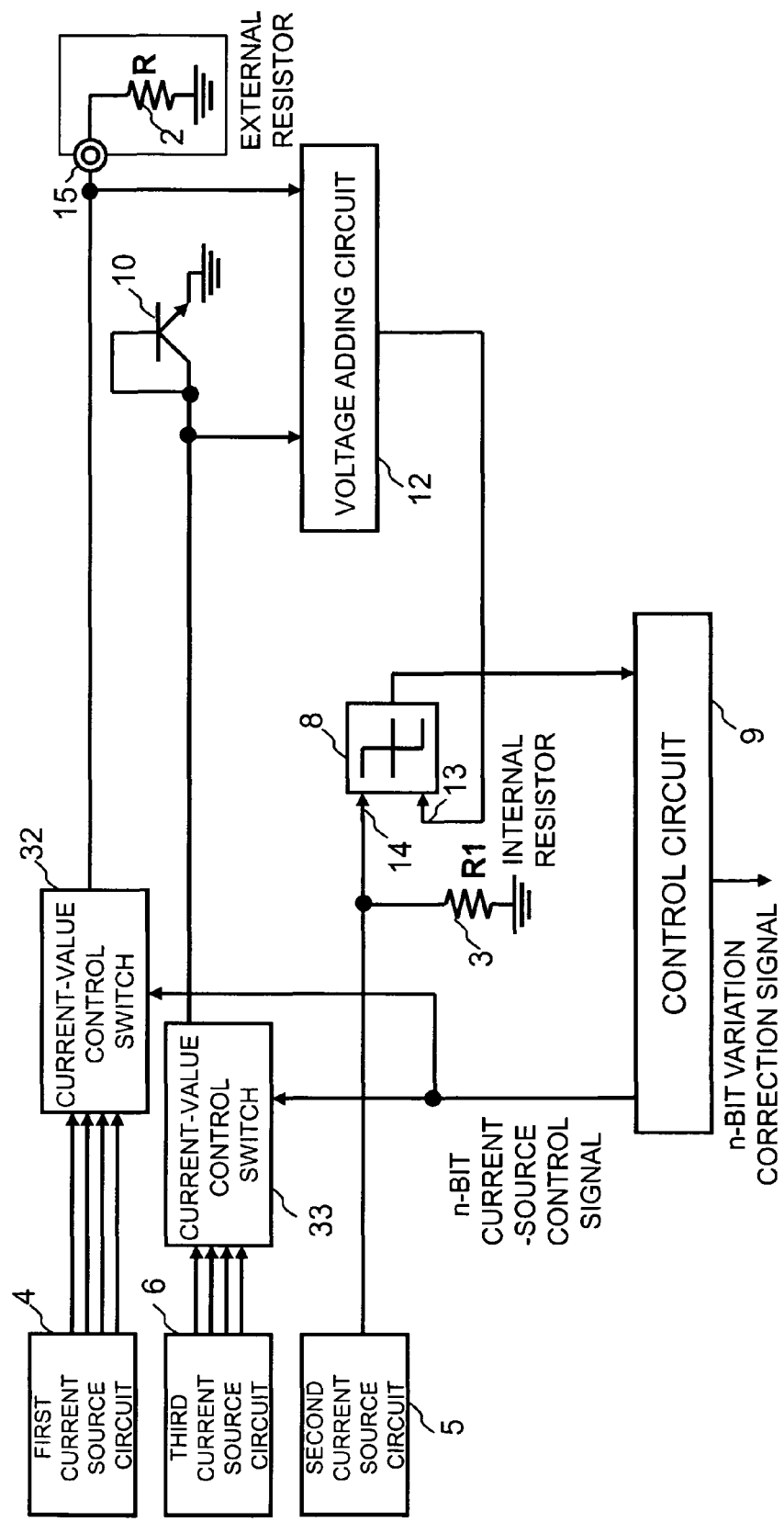
FIG. 20 is a block diagram of a resistance variation detection circuit according to a 15th example of the present invention.

Further, as illustrated in FIGS. 18 to 20, the resistance variation detection circuit 1 of the present invention further comprises a third current source circuit 6 for supplying current to the diode 10; and a voltage adding circuit 12 for adding a voltage across the first resistor 2 and a voltage across the diode 10. An output terminal of the voltage adding circuit 12 is connected to the first input terminal 13 of the voltage comparator circuit 8.

Figure 3:
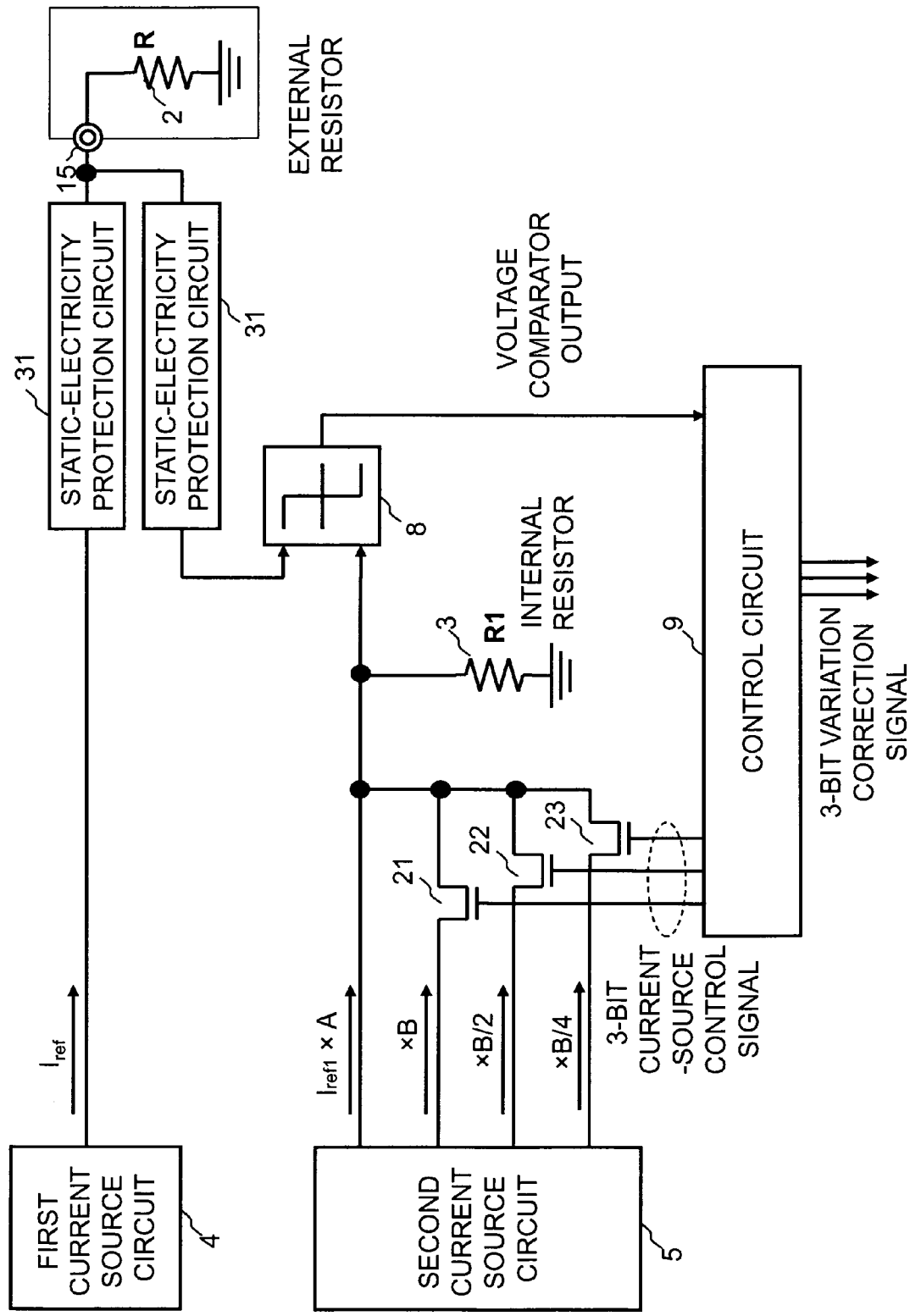
FIG. 3 is a block diagram of a resistance variation detection circuit according to a second example of the present invention.
Figure 22:
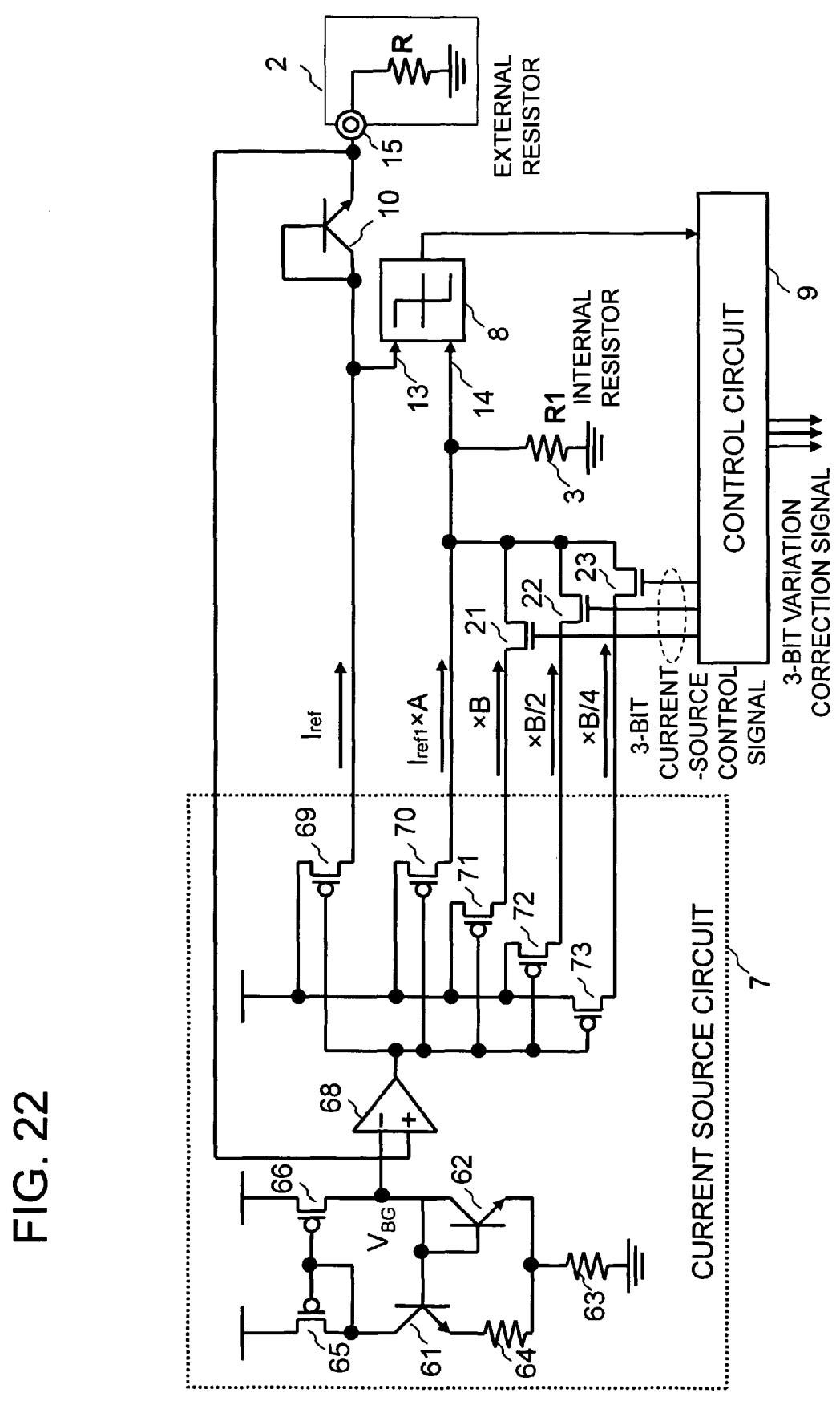
Figure 23:
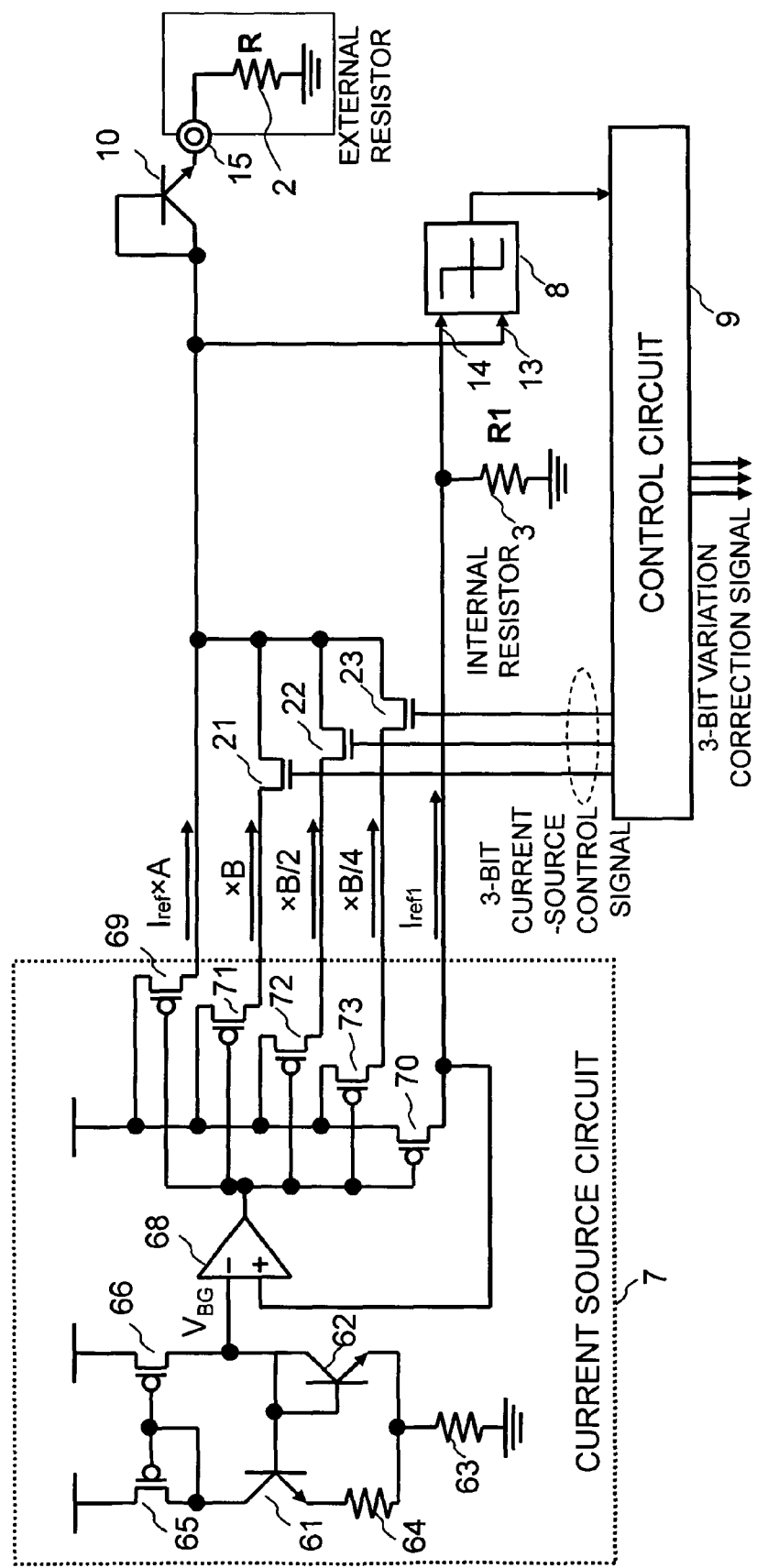
FIG. 23 is a block diagram of a resistance variation detection circuit according to a 18th example of the present invention.

Further, as illustrated in FIGS. 22 and 23, the resistance variation detection circuit 1 of the present invention is such that the first and second current source circuits (4, 5 or 7) are a current source circuit 7 in which either the first resistor 2 or second resistor 3 serves as a current-source reference resistor (2 in FIG. 22 and 3 in FIG. 23)

As illustrated in FIGS. 1, 3, 5, 9 to 20, 22 and 23, a semiconductor device having a resistance variation detection function according to the present invention includes a semiconductor substrate on which the resistance variation detection circuit 1 is formed with the exception of either one of the first and second resistors 2, 3, and has a terminal 15 for one resistor (an external resistor in each of these drawings). In accordance with this arrangement, variation of a resistor incorporated within a semiconductor device can be obtained using the resistance value of the external resistor as a reference.

A resistance variation detection method according to the present invention includes providing a measurement circuit. The measurement circuit includes a first resistor 2; a second resistor 3; a first current source circuit 4 for supplying current to the first resistor 2; a second current source circuit 5 for supplying current to the second resistor 3; and a plurality of switches (21 to 23, 32, 33) for digitally adjusting the supply current of at least one of the first or second current source circuit 4, 5. The method further includes; presetting the plurality of switches and supplying currents to the first and second resistors 2, 3 from the first and second current sources 4, 5 based on setting of the switches (21 to 23, 32, 33); comparing a voltage across the first resistor 2 and a voltage across the second resistor 3; changing over the plurality of switches (21 to 23, 32, 33) and repeating the comparing in case of necessity; and detecting a ratio of resistance values of said first and second resistors 2, 3 based on the setup of the switches and the comparing result.

Examples of the present invention will now be described in detail with reference to the drawings.

FIRST EXAMPLE

FIG. 1 is a block diagram of the resistance variation detection circuit 1 according to a first example of the present invention. The resistance variation detection circuit 1 is formed on a single semiconductor substrate with the exception of the externally provided first resistor 2. As already described, this arrangement comprises the external first resistor 2; the first current source circuit 4, which generates a reference current $I_{ref}$; the second resistor 3, which is incorporated in the integrated circuit; a set of current sources whose current values are A, B, B/2 and B/4 times $I_{ref1}$; switch transistors (NMOS transistors) 21 to 23 for turning on and off the currents that are B, B/2 and B/4 times $I_{ref1}$, respectively; the voltage comparator circuit 8; and the control circuit 9. The set of the plurality of currents that are output from the second current source circuit 5 and the switch transistors (NMOS transistors) 21 to 23 can be regarded as the second current source circuit 5 in which the current value is controllable using 3-bit digital data.

Let $I_{ref}=I_{ref1}$, A=0.86, B=0.16 hold in order to describe the invention in more concrete form. In this case the second current source circuit 5 is capable of having its output current varied in eight steps in increments of 0.04 over a range that is 1±0.14 times the first reference current $I_{ref}$.

The resistance R of the first resistor 2, which is a reference resistor, is selected so that R=R1 holds when the second resistor 3 has a center value of variation.

Figure 2:
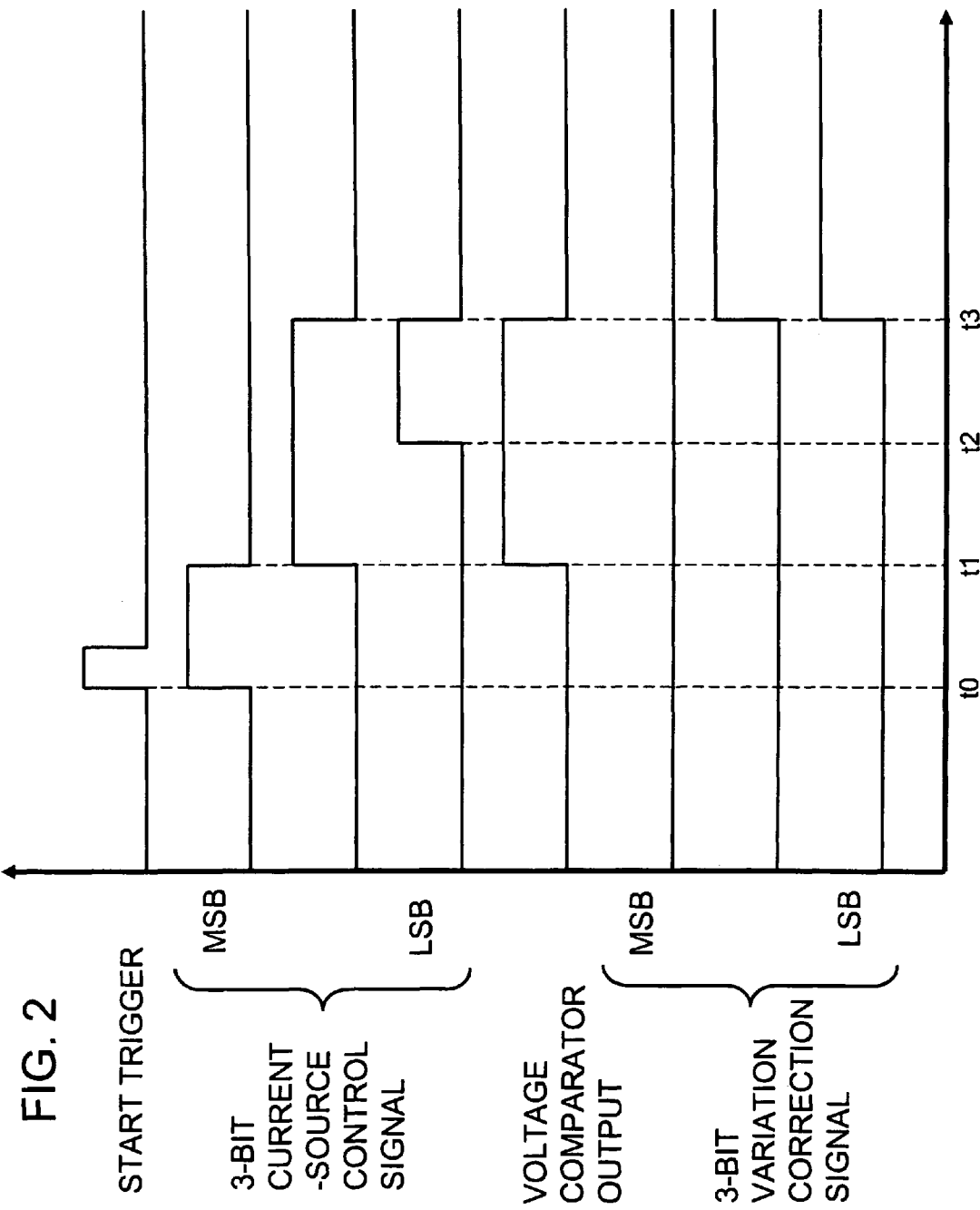
FIG. 2 is an operation timing chart of the resistance variation detection circuit according to the first example.

An example of operation of the circuit shown in FIG. 1 will be described with reference to FIG. 2. This circuit starts operating in synch with a rising edge t0 of a start trigger supplied from outside the circuit. Points at which the output of the voltage comparator circuit 8 transitions from the high to the low level or from the low to the high level are determined in the manner of a binary search.

The details of the binary-search operation are as follows: First, a 3-bit signal that controls the second current source circuit 5 is set to "100". Since a low level is obtained as the output of the voltage comparator circuit 8 at this time, it will be understood that (voltage across the first reference resistor 2)<(voltage across the second reference resistor 3) holds, i.e., that the value of the MSB should be placed at the low level. In response to this result, the 3-bit signal is set to "010" at the next timing t1. Since a high level is obtained as the output of the voltage comparator circuit 8 at this time, it will be understood that (voltage across the first reference resistor 2)>(voltage across the second reference resistor 3) holds, i.e., that the value of the second bit should be made high. In response to this result, the 3-bit signal is set to "011" at the next timing t2. Since a high level is obtained as the output of the voltage comparator circuit 8 at this time, it will be understood that (voltage across the first reference resistor 2)>(voltage across the second reference resistor 3) holds, i.e., that the value of the LSB should be made high. By virtue of this operation, the 3-bit signal "011" obtained is output externally as the variation correction signal.

In the first example, it goes without saying that both in a case where $I_{ref1}$ is selected to be a value different from $I_{ref}$ and in a case where A and B are selected to be values different from those used in the foregoing description, the correspondence between the amount of variation of the resistance value R1 of the second resistor 3 and the variation correction signal eventually obtained merely changes and that equivalent functions and effects can be obtained.

Further, in the first example, the terminals of the first resistor 2 and second resistor 3 not connected to the voltage comparator circuit 8 are connected to ground. However, it goes without saying that similar functions and effects can be obtained even with an arrangement in which the two resistors are connected to nodes having identical potential other than ground. Furthermore, in the first example, it goes without saying that similar functions and effects can be obtained even with an arrangement in which the two resistors are connected to positive power-source nodes of the same potential and the current direction of the current sources is the opposite.

SECOND EXAMPLE

FIG. 3 is a block diagram of the resistance variation detection circuit 1 according to a second example of the present invention. This arrangement differs in that the resistance variation detection circuit 1 according to the first example shown in FIG. 1 is additionally provided with electro-static discharge protection circuits 31. The basic principle and operation of this example, therefore, are the same as in the first example. The circuit of this arrangement can also be regarded as being exactly the same as that of the circuit of FIG. 1 if the electro-static discharge protection circuit 31 connected to the first current source circuit 4 is regarded as part of the first current source circuit 4 and the electro-static discharge protection circuit 31 connected to the voltage comparator circuit 8 is regarded as part of the voltage comparator circuit 8.

THIRD EXAMPLE

Figure 4:
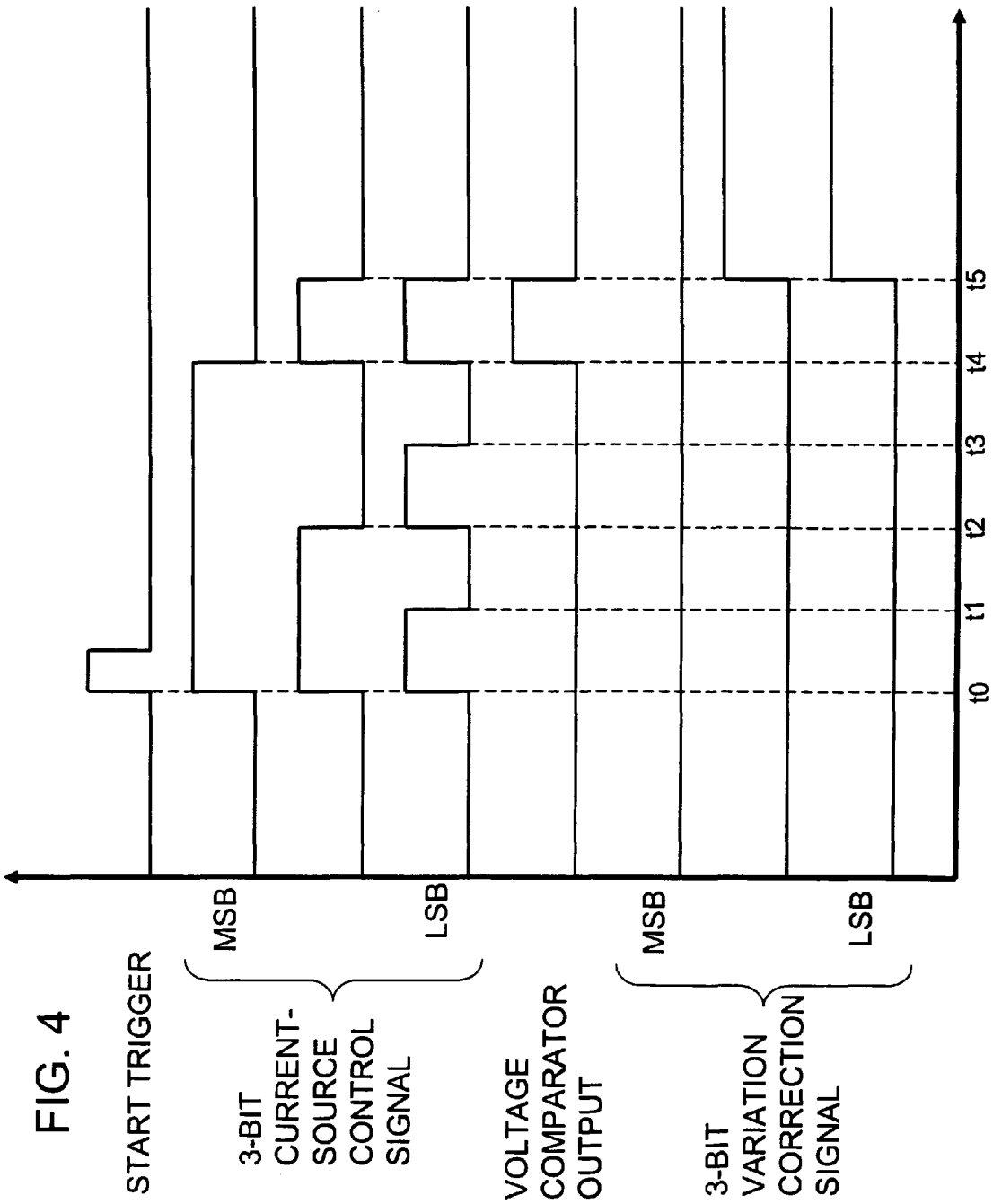
FIG. 4 is an operation timing chart of the resistance variation detection circuit according to a third example of the present invention.

A third example is identical with the resistance variation detection circuit 1 of FIG. 1 in terms of the arrangement of the blocks. However, the control of the switch transistors 21 to 23 by the current-source control signal from the control circuit 9 is different. FIG. 4 is an operation timing chart of the resistance variation detection circuit 1 according to a third example. In the third example, the circuit starts operating in synch with the rising edge of the start trigger supplied from outside the circuit at timing t0. The current-source control signal is then reduced from "111" successively one LSB at a time and the output of the voltage comparator circuit 8 is monitored. At the moment the current-source control signal becomes "011", the output of the voltage comparator circuit 8 changes from the low to the high level. The current-source control signal "011" at this time, therefore, is output from the control circuit 9 as the variation correction signal.

FOURTH EXAMPLE

Figure 5:
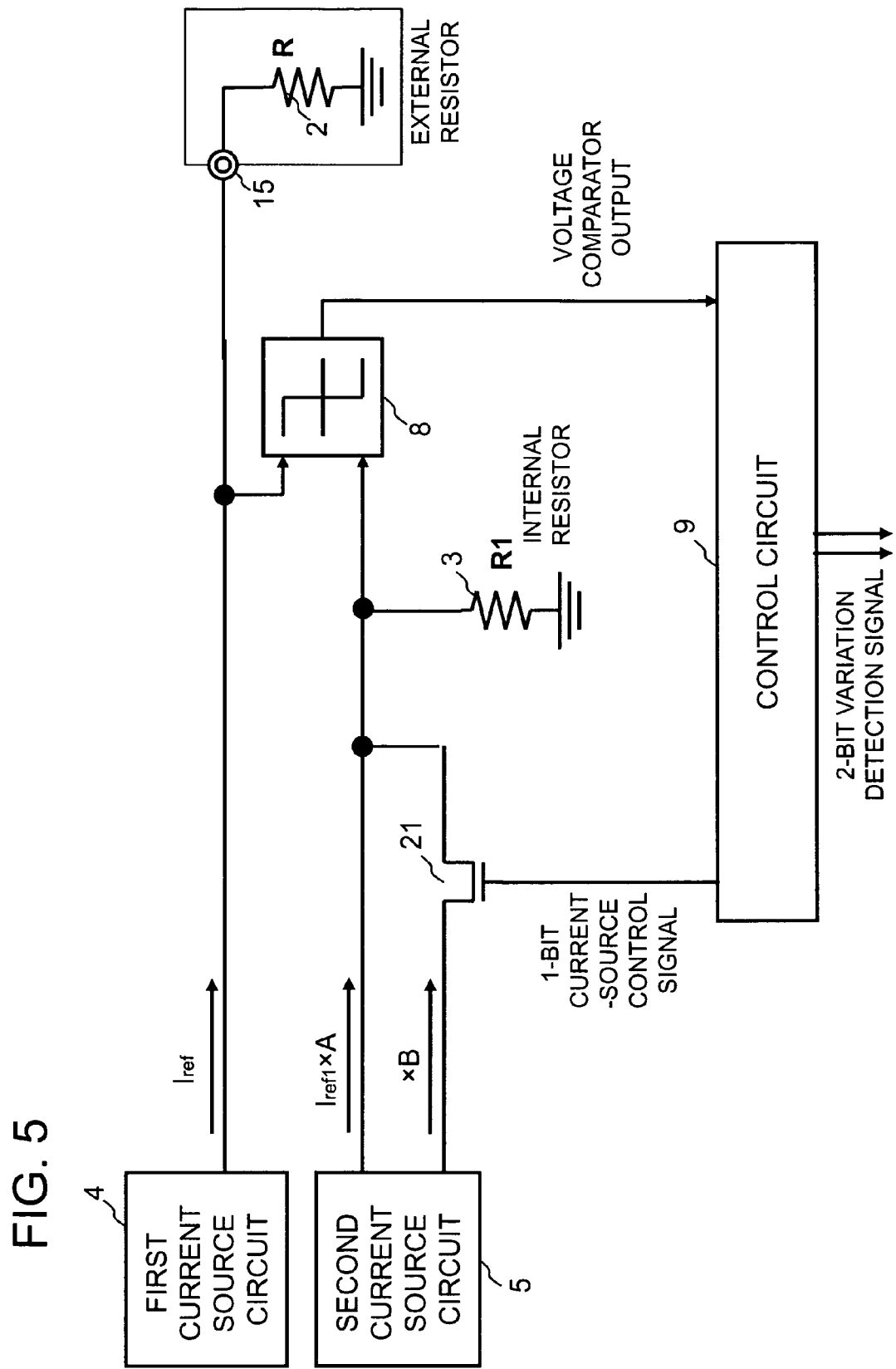
FIG. 5 is a block diagram of a resistance variation detection circuit according to a fourth example of the present invention.

FIG. 5 is a block diagram of the resistance variation detection circuit 1 according to a fifth example of the present invention. This arrangement is such that the current-source control signal in the resistance variation detection circuit 1 of the first example shown in FIG. 1 is reduced from three bits to one bit. The control circuit 9 output a 2-bit variable detection signal.

Figure 6:
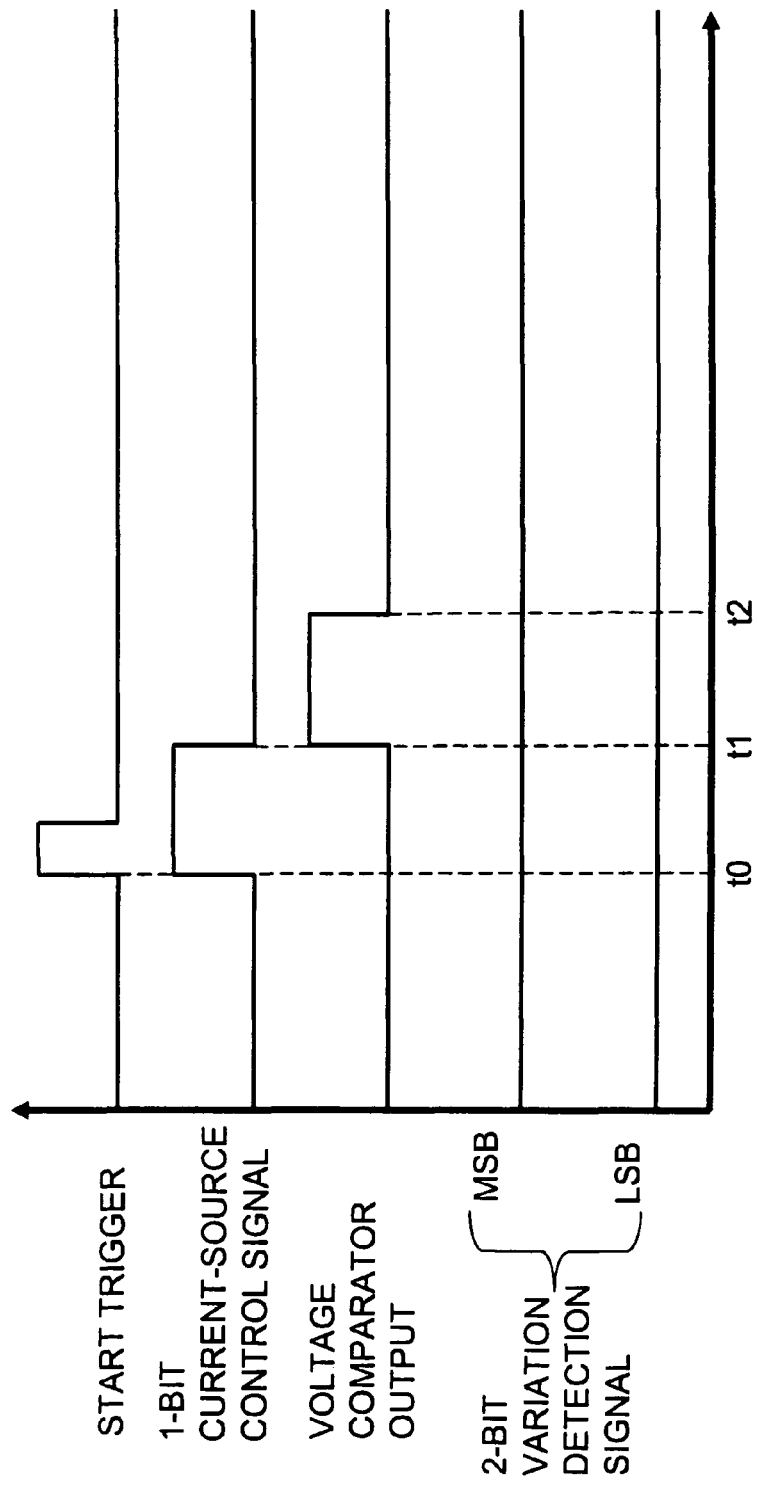
FIG. 6 is an operation timing chart (1) of the resistance variation detection circuit according to the fourth example (in a case where amount of variation of a resistance value falls within a prescribed range.

The operation of the fourth example will be described with reference to FIGS. 6, 7 and 8. In the fourth example, the circuit starts operating in synch with the rising edge of the start trigger supplied from outside the circuit at timing t0. The current-source control signal is then varied from the high level to the low level successively at the timings of t0 to t1 and t1 to t2 and the output of the voltage comparator circuit 8 is monitored. FIG. 6 illustrates a case where the output of the voltage comparator circuit 8 takes on the low and high levels successively. In this case the 2-bit variation detection signal is "00" and this indicates that the variation of the resistance element is within a certain prescribed range.

Figure 7:
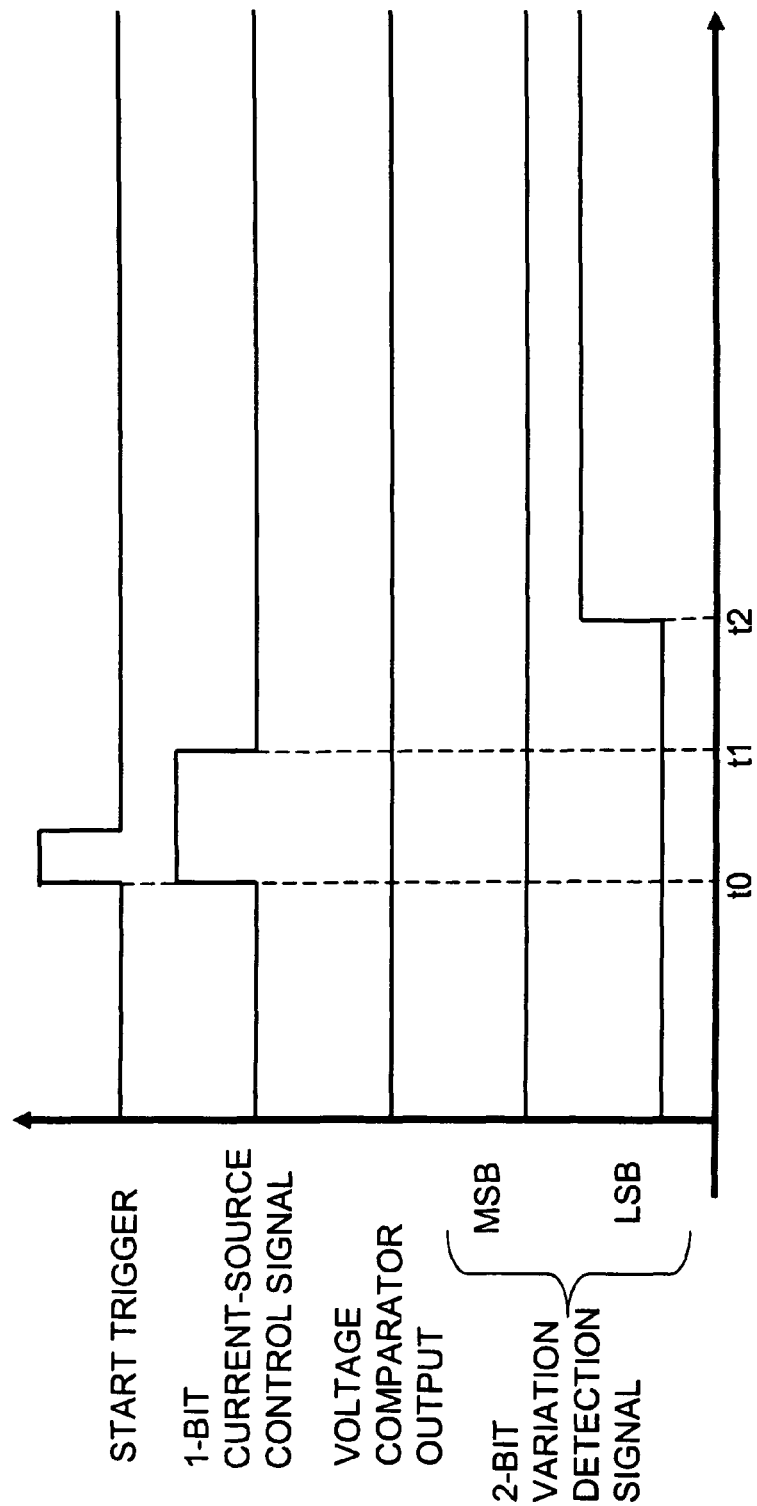
FIG. 7 is an operation timing chart (2) of the resistance variation detection circuit according to the fourth example (in a case where amount of variation of a resistance value is below a prescribed range.

FIG. 7 illustrates a case where the output of the voltage comparator circuit 8 takes on the low level successively. In this case the 2-bit variation detection signal is "01" and this indicates that the variation of the resistance element overshoots the prescribed range on the high-resistance side. FIG. 8 illustrates a case where the output of the voltage comparator circuit 8 takes on the high level successively. In this case the 2-bit variation detection signal is "10" and this indicates that the variation of the resistance element undershoots the prescribed range on the low-resistance side. That is, the MSB of the variation detection signal indicates that the resistance has shifted to the fast side, namely the side of low resistance, and the LSB indicates that the resistance has shifted to the slow side, namely the side of high resistance.

In the fourth example, it is possible to use the variation detection signal as the variation correction signal as a matter of course. In such case the only difference would be that the variation detection signal in the examples mentioned thus far would be a tri-state signal. The functions and effects obtained are the same. Further, the variation detection signal of the fourth example can also be utilized as a signal for detecting a defect in the performance of the device. In this example it is of course possible to make a pass/fail binary evaluation of device performance by taking the logical OR between the two bits of the 2-bit variation detection signal.

FIFTH EXAMPLE

Figure 9:
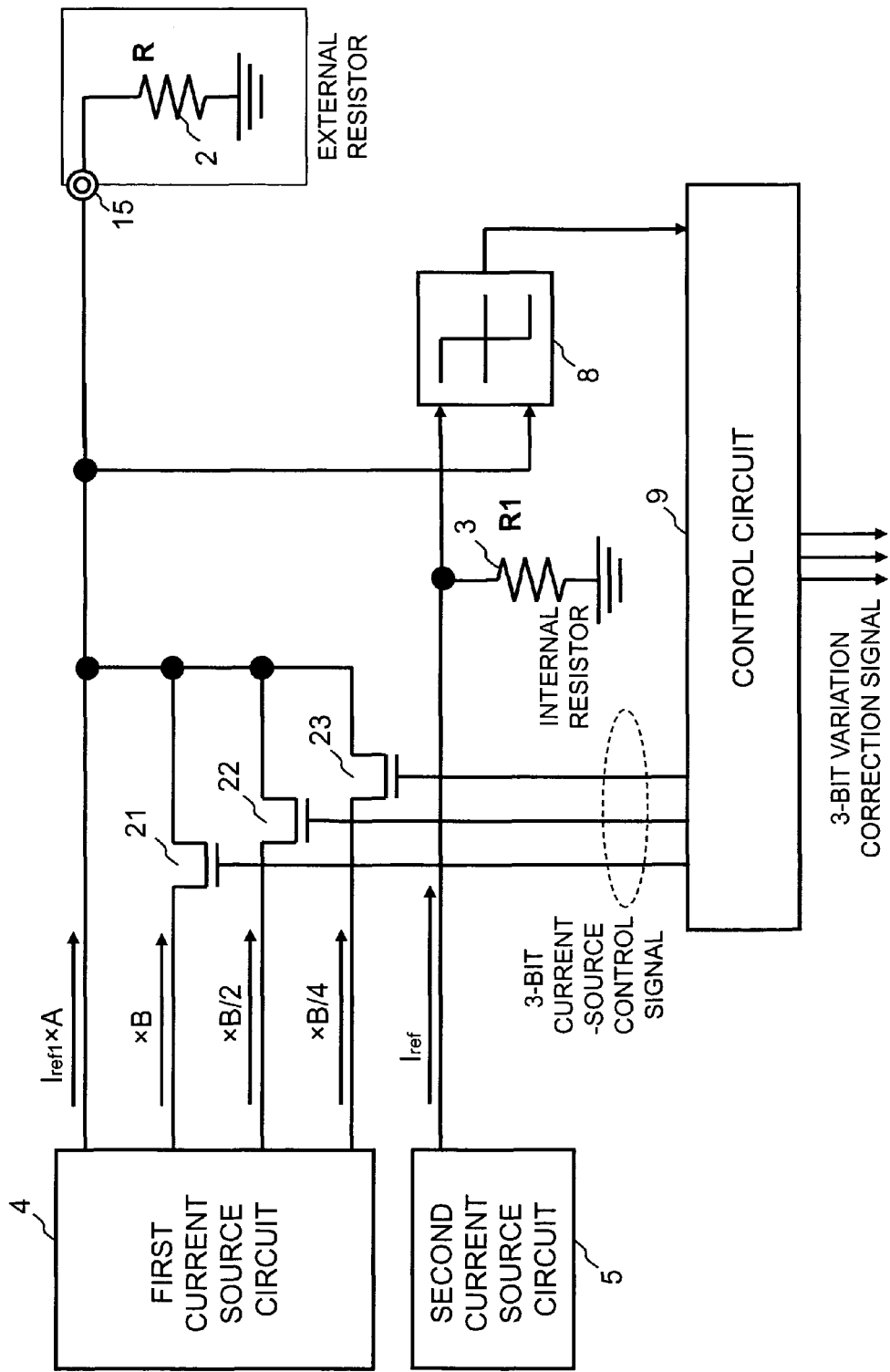
FIG. 9 is a block diagram of a resistance variation detection circuit according to a fifth example of the present invention.

FIG. 9 is a block diagram of the resistance variation detection circuit 1 according to a fifth example of the present invention. With the resistance variation detection circuit 1 according to the first example shown in FIG. 1, the current passed into the second resistor 3, which is the internal resistor, is controlled by the current-source control signal. In the arrangement of this example, however, the current that flows into the first resistor 2, which is the external resistor, is controlled by the current-source control signal. The basic operation is the same as that of the first example. Further, the control of the currents of first current source circuit 4 by the current-source control signal from the control circuit 9 can be performed by the same method as that of FIG. 2 or 4. The functions and effects obtained by the fifth example are similar to those of the first example.

SIXTH EXAMPLE

Figure 10:
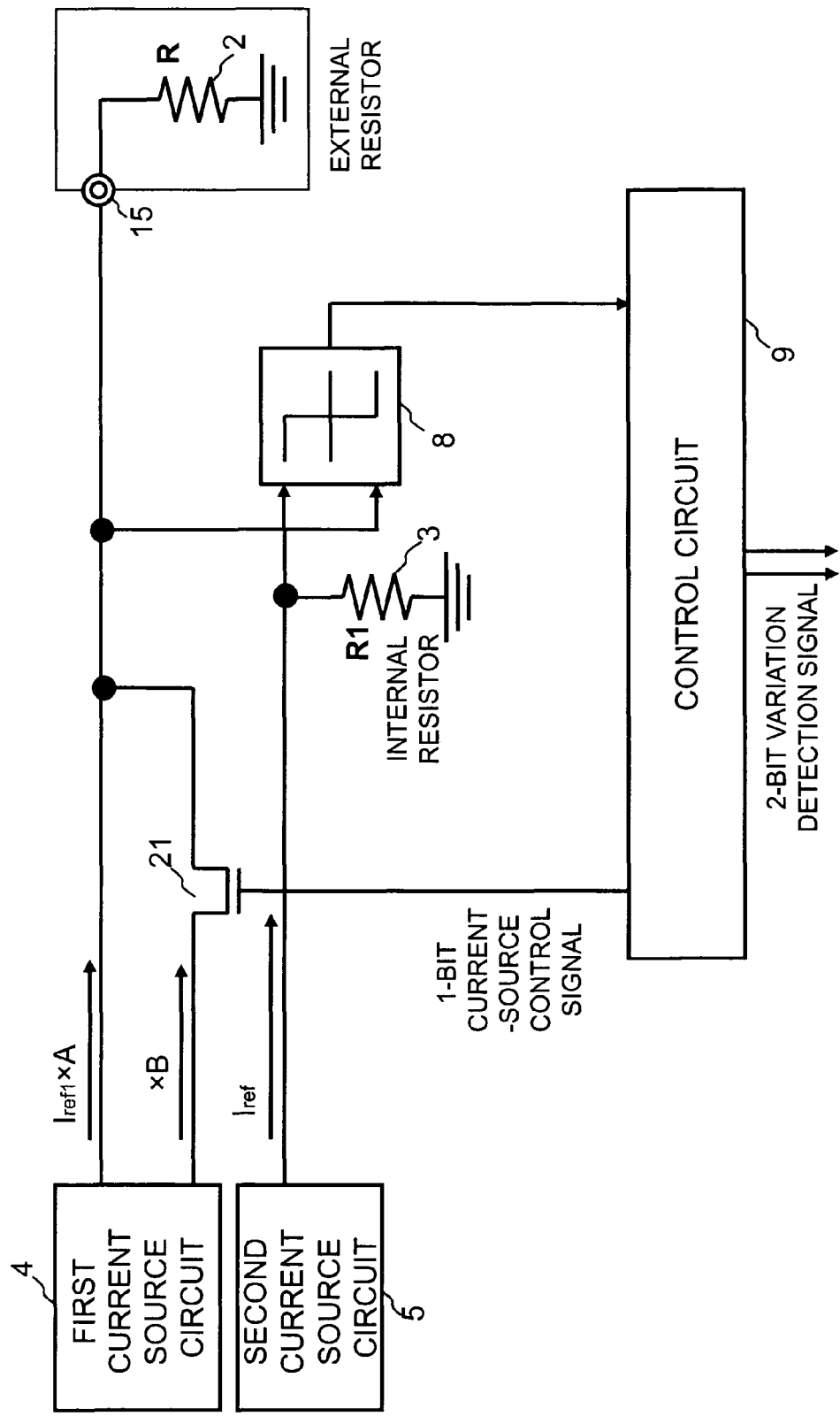
FIG. 10 is a block diagram of a resistance variation detection circuit according to a sixth example of the present invention.

FIG. 10 is a block diagram of the resistance variation detection circuit 1 according to a sixth example of the present invention. This arrangement is such that the current-source control signal in the resistance variation detection circuit 1 of the fifth example shown in FIG. 9 is reduced from three bits to one bit. With the resistance variation detection circuit 1 according to the fourth example, the amount of current passed from the second current source circuit 5 into the second resistor 3, which is incorporated within the integrated circuit, is controlled by the current-source control signal. In the arrangement of this sixth example, however, the current that flows from the first current source circuit 4 into the first resistor 2, which is the external resistor, is controlled by the current-source control signal.

Figure 8:
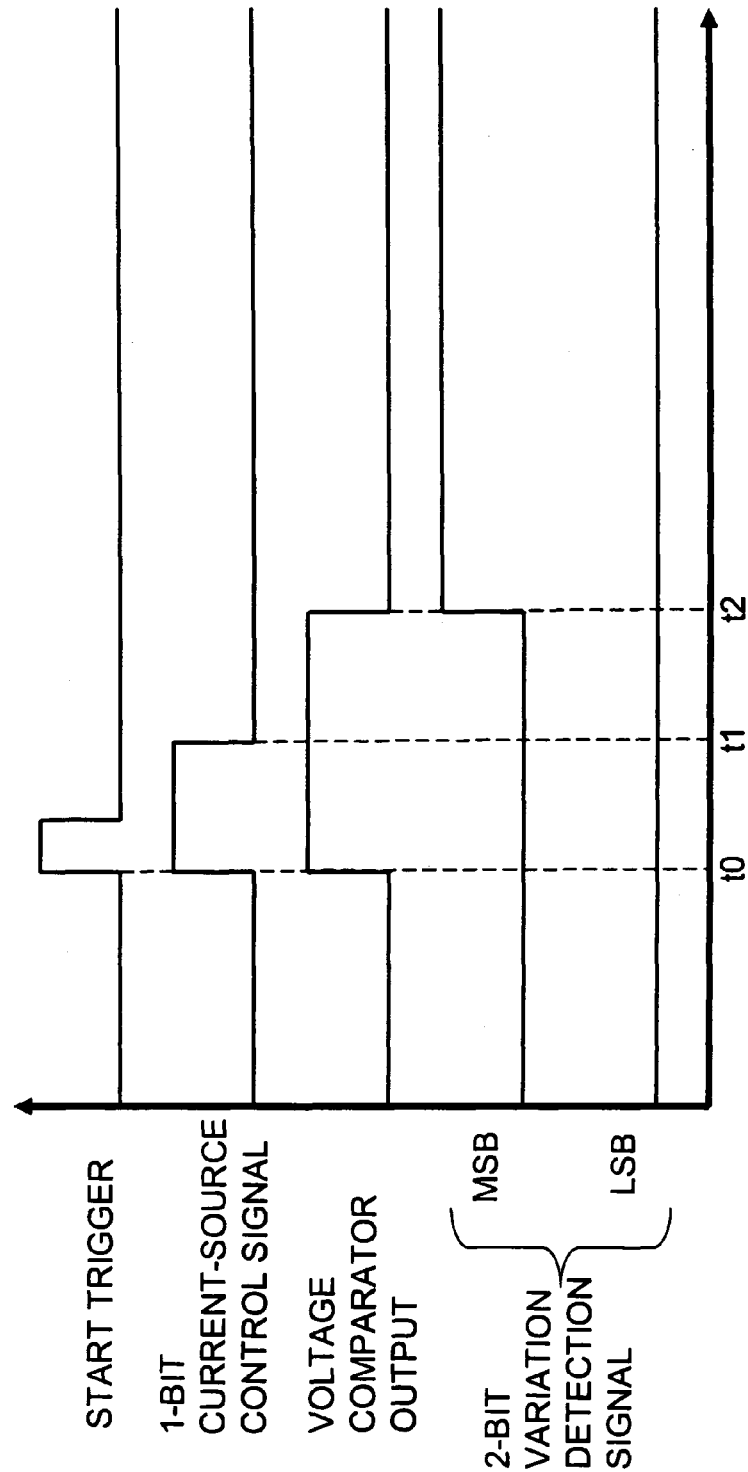
FIG. 8 is an operation timing chart (2) of the resistance variation detection circuit according to the fourth, example (in a case where amount of variation of a resistance value is above a prescribed range.

Control of the current-source control signal and variation detection can be performed through a procedure the same as that shown in FIGS. 7, 8 and 9 already described. The functions and effects obtained are similar to those according to the fourth example.

SEVENTH EXAMPLE

Figure 11:
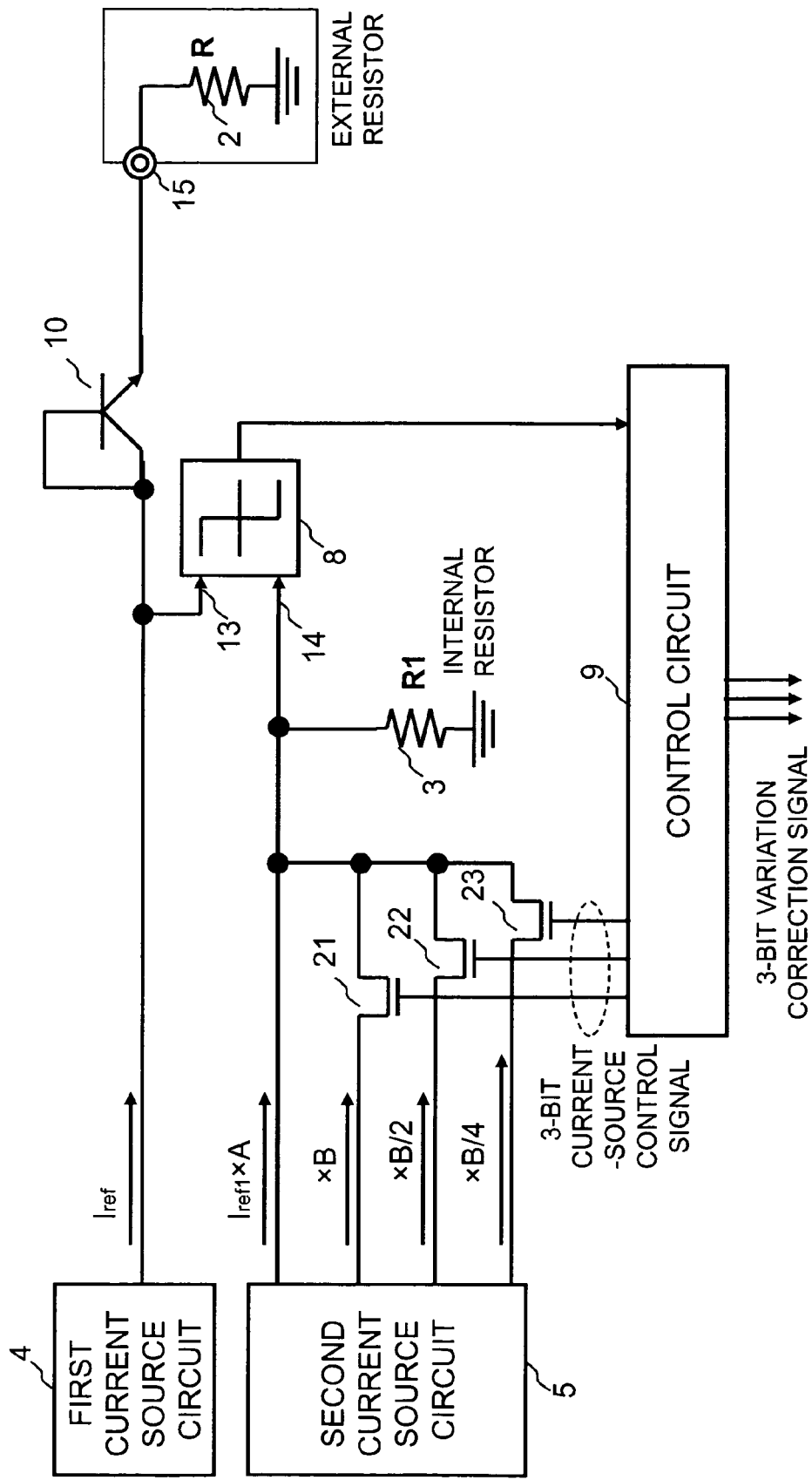
FIG. 11 is a block diagram of a resistance variation detection circuit according to a seventh example of the present invention.

FIG. 11 is a block diagram of the resistance variation detection circuit 1 according to a seventh example of the present invention. The arrangement of FIG. 11 is obtained by replacing the external first resistor 2 (the reference resistor) in the arrangement of FIG. 1 already described with a circuit in which the external first resistor 2 and a diode-connected bipolar transistor 10 are serially connected. The diode-connected bipolar transistor will be referred to simply as "diode 10" below.

In this example, let $I_{ref}=I_{ref1}$, A=0.86, B=0.16 hold. That is, the second reference current supplied from the second current source circuit 5 can be output by being varied in eight steps in increments of 0.04 over a range that is 1±0.14 times the first reference current supplied from the first current source circuit 4.

The value of the resistance value R of the external first resistor 2 is selected as follows: First, in the arrangement of FIG. 11, the temperature coefficient of the resistance value R1 of the internal second resistor 3 is negative and the relationship (temperature coefficient of R1)<(temperature coefficient of R) holds. Let Vf represent the voltage across the diode 10 when its current is $I_{ref}$. The basic property of a diode is that the more temperature rises, the smaller Vf becomes. Further, if $I_{ref}$ is constant, the smaller the diode size and the higher the diode current density, the more the temperature dependency of Vf declines. By utilizing this property, the size of the diode 10 and the value of R are selected in such a manner that $I_{ref} \times R1$ will fall within a certain fixed error with respect to $I_{ref} \times R+Vf$, e.g., within a range of 1%, in a certain assumed temperature range, e.g., −20° C. to 85° C., when the value of R1 is the center value of variation due to manufacture. More specifically, the value of R and the size of the diode 10 are selected in such a manner that the discrepancy in the temperature coefficients of R and R1 will be accommodated for by the diode 10.

The potential at the node of the internal second resistor 3 on the current-source side and the potential at the node of the diode 10 on the current-source side are compared by the voltage comparator circuit 8. The control circuit 9 in FIG. 11 searches for digital data prevailing when the output of the voltage comparator circuit 8 transitions from the high to the low level. More specifically, the control circuit 9 operates in accordance with the flow illustrated in FIG. 2 or FIG. 4 already described.

The above-described arrangement is such that in a case where variation due to manufacture is zero, the control circuit 9 of FIG. 11 outputs 3-bit data, namely "001", as the variation correction signal, at any temperature. The reason is that the discrepancy in the temperature coefficients of R and R1 is accommodated for by the diode 10. In a case where variation due to manufacture exists, the same variation correction data is obtained at any temperature.

Specifically, the extent of difference in temperature dependency curves of actually fabricated R1 and ideal R1 in a case where variation is zero can be obtained.

With the resistance variation detection circuit 1 of this example, functions and effects similar to those of the first example are obtained in a case where the circuit is used in a constant temperature environment. In addition, functions and effects set forth below are obtained in an environment where temperature fluctuates.

First, consider a case where the resistance variation detection circuit 1 according to this example is used in evaluating the performance of the resistance value R1 of the second resistor 3 incorporated in the integrated circuit and, moreover, the resistance value of the second resistor 3, which is the target of evaluation, has an amount of negative temperature dependency that cannot be ignored. In order to implement this function using the arrangement of FIG. 1 in this specification or the prior art described in Patent Documents 1 and 2, it is required that the temperature at the time of operation be strictly managed, or that a correction be applied to data that has been obtained by separately measured temperature at the time of operation, or that the temperature dependency of the first resistor 2 (the external resistor) be aligned with that of the second resistor 3 (the internal resistor) which is the target of evaluation. By contrast, if the resistance variation detection circuit 1 according to this example is used, it is not necessary to manage the temperature at the time of operation, it is not necessary to measure the temperature at the time of information and it is not necessary to align the temperature dependency of the first resistor 2 (the external resistor) with that of the second resistor 3 (the internal resistor).

Consider the following analog integrated circuit as another application to which this example is applied: The analog integrated circuit is equipped with the resistance variation detection circuit 1 according to this example and corrects a variation in a resistor due to manufacture. The resistance element used in this analog integrated circuit has an amount of negative temperature dependency that cannot be ignored. Further, the analog integrated circuit is required to operate continuously after being started up, there is the possibility that the temperature will fluctuate during continuous operation, and a continuous change in operating state ascribable to changeover of the resistance-variation-correction signal during continuous operation is not permitted.

First of all, since a changeover of the resistance-variation-correction signal during continuous operation is not permitted in such case, a suitable arrangement is one in which the variation detection operation is performed just once at start-up and the variation correction signal obtained at this time is kept in the continuous operation. Further, since the temperature at which the variation detection operation is performed is not given and a change in temperature after start-up can occur, it is necessary to obtain a variation detection result that is not dependent upon temperature.

With the resistance variation detection circuit 1 according to this example, the extent of a difference in to which the actual temperature dependency curves of actually fabricated R1 and ideal R1 in a case where variation is zero can be obtained, as already mentioned. Accordingly, since it is possible to apply a correction to the shift caused by the manufacturing variation, it will suffice to adopt a design that deals solely with fluctuation of the second resistor 3 (the internal resistor) due to the fluctuation in temperature.

For the sake of making a comparison, consider a case where no correction whatsoever is applied. In this case, it is required that each block of the analog integrated circuit be designed so as deal with the sum of the shift in resistance value R1 caused by variations in manufacture and temperature fluctuations. Further, in a case where arrangement shown in FIG. 1 is used, a problem which arises is that the amount of correction fluctuates in dependence upon temperature when the correction is made. In this case it is necessary to adopt a design that deals with the sum of the fluctuation of the resistance value R1 due to temperature fluctuations and the fluctuation in amount of correction due to the temperature at the time of start-up.

It should be noted that in a case where the relationship (temperature coefficient of resistance value R1)<(temperature coefficient of resistance value R) holds in this example even though the temperature coefficient of the resistance value R1 is positive, it goes without saying that similar operation and effects can be obtained by suitably selecting the resistance value R and the size of the diode.

It should be noted that it is possible to adopt a design in which $I_{ref} \times R1$ possesses a certain temperature gradient with respect to $I_{ref} \times R + Vf$ in a certain assumed temperature range. The method of selecting the value of the resistance value R of the first resistor 2 (external resistor) and the size of the diode in this case is used as a parameter for adjusting the above-mentioned temperature gradient. Mitigating the temperature dependency of the analog circuit characteristic by providing the resistance-variation detection signal with a certain specific temperature dependency can be mentioned as an example of application of the resistance variation detection circuit 1 thus designed.

In this example, in both a case where $I_{ref1}$ has been selected to be a value different from $I_{ref}$ and a case where A and B have been selected to be values different from those used in the description rendered above, it goes without saying that equivalent functions and effects can be obtained with there just being a change in dealing with the amount of variation of the resistance value R1 and the variation correction signal finally obtained.

Further, in this example, it goes without saying that similar functions and effects can be obtained even with an arrangement in which one ends of the two resistors are not grounded nodes but are connected to power-source nodes of the same potential. Furthermore, in this example; it goes without saying that similar functions and effects can be obtained even with an arrangement in which the two resistors are connected to positive power-source nodes of the same potential and the current direction of the current sources and the direction in which the diode is connected are both made the opposite directions.

EIGHTH EXAMPLE

Figure 12:
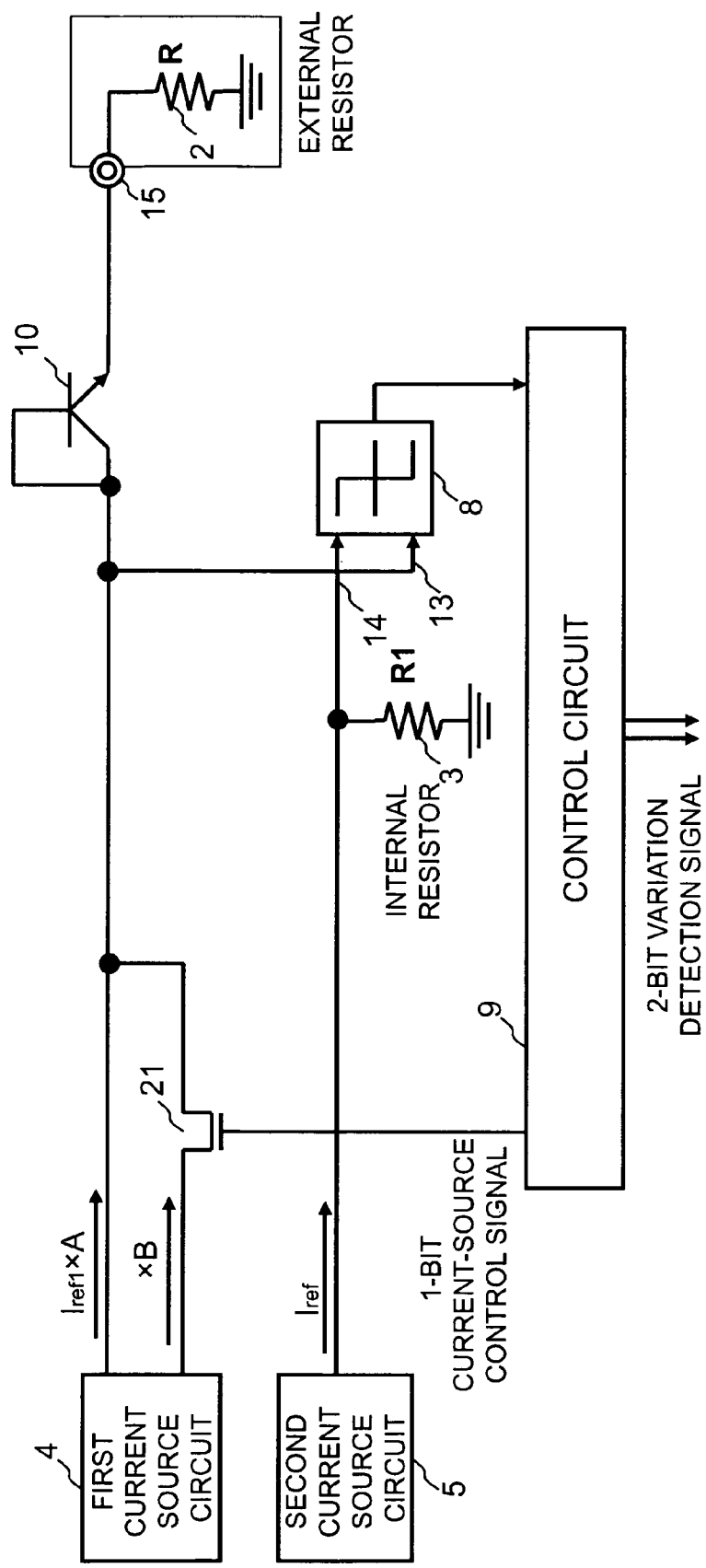
FIG. 12 is a block diagram of a resistance variation detection circuit according to an eighth example of the present invention.

FIG. 12 is a block diagram of the resistance variation detection circuit 1 according to an eighth example of the present invention. This arrangement is such that the current-source control signal in the resistance variation detection circuit 1 of the seventh example shown in FIG. 11 is reduced from three bits to one bit and the current that flows into the first resistor 2 (external resistor) and diode 10 from the first current source circuit 4 is controlled by the current-source control signal instead of the current that flows into the second resistor 3 (internal resistor) from the second current source circuit 5 being controlled by the current-source control signal. With regard to the flow of the control operation performed by the control circuit 9, control can be carried out by a method similar to that shown in FIGS. 6, 7 and 8 already described.

Further, in the foregoing example, it is also possible for the variation detection signal that is output from the control circuit 9 to be used as the variation correction signal as a matter of course. In such case the only difference would be that the variation detection signal in the seventh example already mentioned would take on three values. The functions and effects obtained are the same. Further, the variation detection signal in this example can also be utilized as a signal for detecting a defect in device performance. In this example it is of course possible to make a pass/fail binary evaluation of device performance by taking the logical OR between the two bits of the 2-bit variation detection signal.

NINTH EXAMPLE

Figure 13:
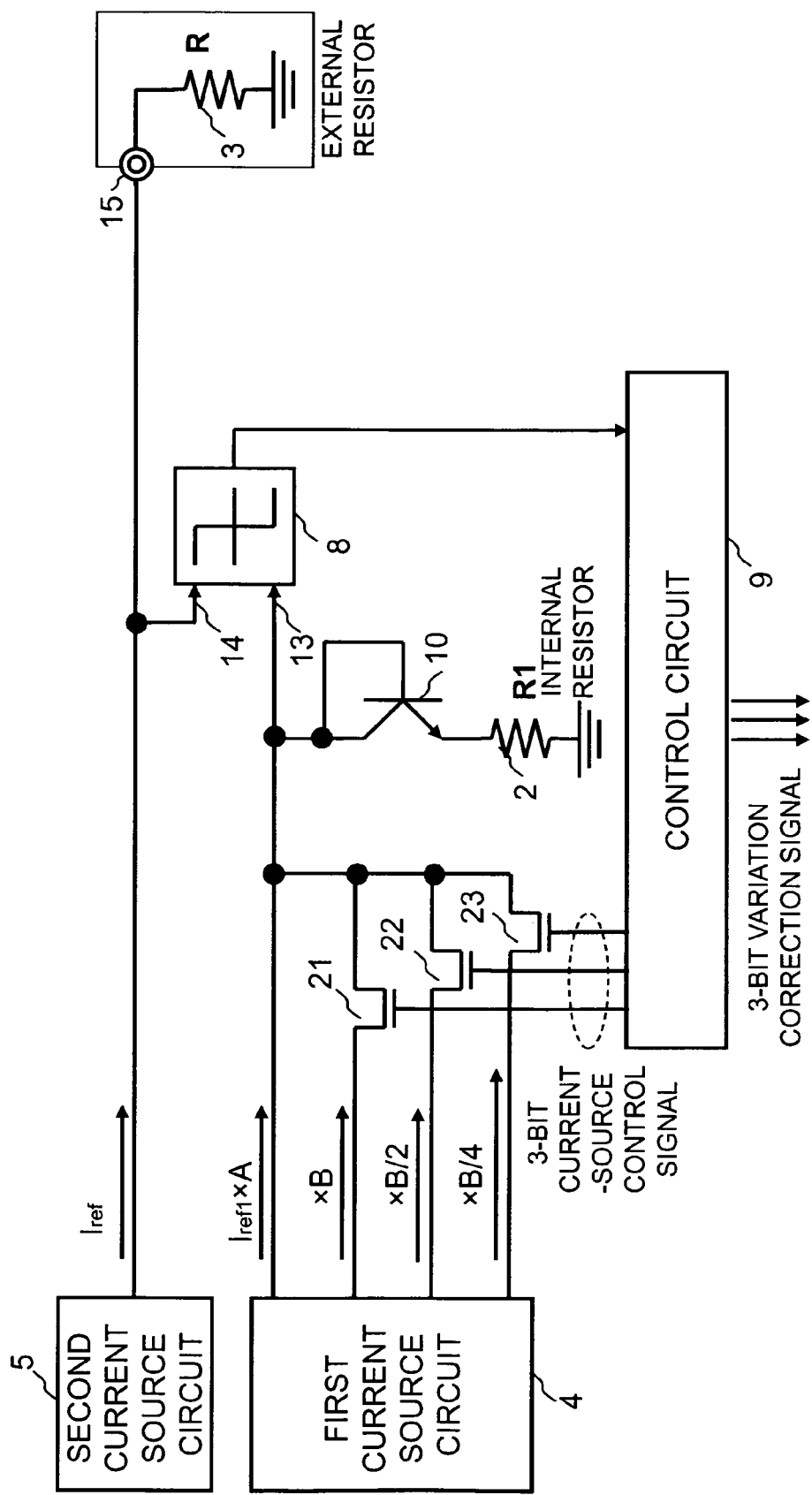
FIG. 13 is a block diagram of a resistance variation detection circuit according to a ninth example of the present invention.

FIG. 13 is a block diagram of the resistance variation detection circuit 1 according to a ninth example of the present invention. This arrangement is such that the diode 10 is moved to the side of internal resistor in the resistance variation detection circuit 1 according to the seventh example shown in FIG. 11. In the ninth example, therefore, the discrepancy in the temperature coefficients of R and R1 can be accommodated for by the diode 10 in a case where the relationship (temperature coefficient of R1)>(temperature coefficient of R) holds.

It should be noted that it is possible to adopt a design in which $I_{ref} \times R$ possesses a certain temperature gradient with respect to $I_{ref} \times R + Vf$ in a certain assumed temperature range. The method of selecting the value of the resistance value R of the external resistor (second resistor 3) and the size of the diode 10 in this case is used as a parameter for adjusting the above-mentioned temperature gradient. Mitigating the temperature dependency of the analog circuit characteristic by providing the resistance-variation detection signal with a certain specific temperature dependency can be mentioned as an example of application of the resistance variation detection circuit 1 thus designed.

TENTH EXAMPLE

Figure 14:
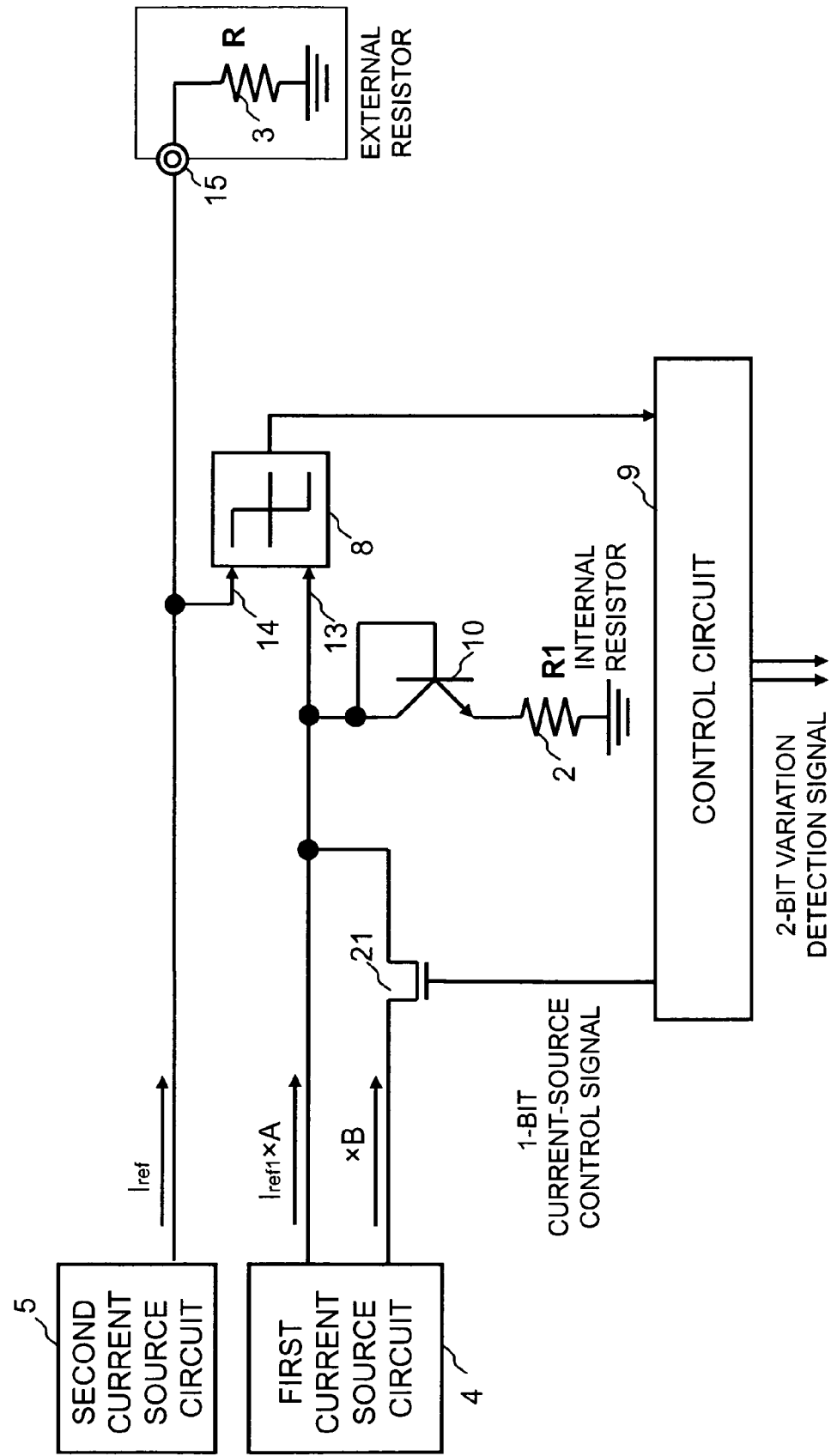
FIG. 14 is a block diagram of a resistance variation detection circuit according to a tenth example of the present invention.

FIG. 14 is a block diagram of the resistance variation detection circuit 1 according to a tenth example of the present invention. This arrangement is such that the current-source control signal in the resistance variation detection circuit 1 of the ninth example shown in FIG. 13 is reduced from three bits to one bit. The procedure for obtaining the variation detection signal by control of the current-source control signal using the control circuit 9 can be the procedure shown in FIGS. 7, 8 and 9 already described. The functions and effects obtained are similar to those according to the ninth example.

11th EXAMPLE

Figure 15:
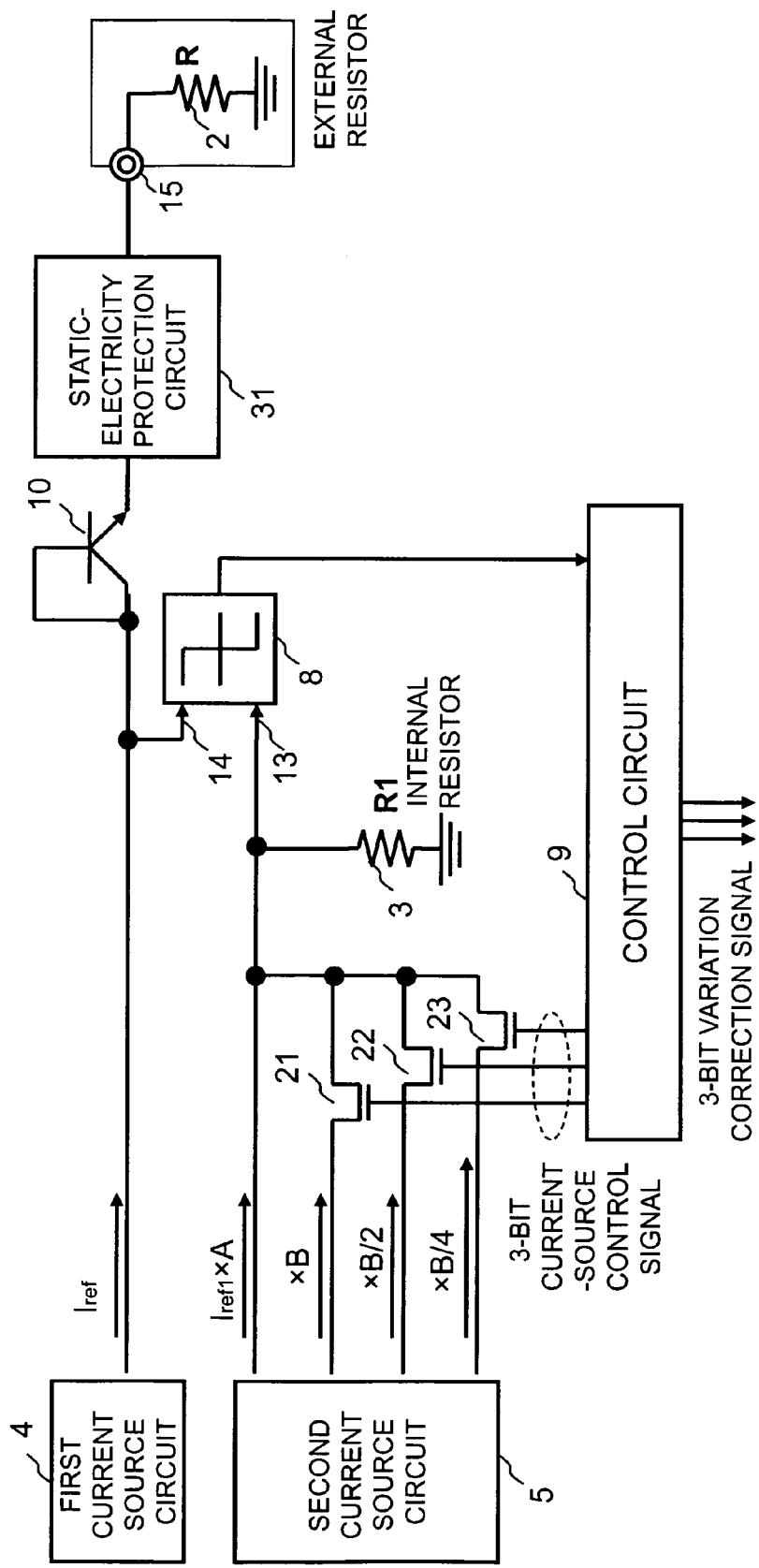
FIG. 15 is a block diagram of a resistance variation detection circuit according to a modification of the seventh example.

Depending upon the time constant of an internal resistance element (especially a diode) of an integrated circuit, there is a case where a electro-static discharge protection circuit 31 is required between this resistance element and the external resistor in the resistance variation detection circuit 1 of FIG. 11 described as the seventh example. Such a circuit is shown in FIG. 15. If normal operation of the resistance variation detection circuit 1 can be implemented by adopting an overall design taking into consideration the series resistance of the electro-static discharge protection circuit 31 such that this resistance will be so small as to have no influence upon the operation of the resistance variation detection circuit 1 or such that the series resistance will be sufficiently small, then the arrangement of FIG. 15 can be used as is. In a case where the influence of the series resistance is not negligible, however, measures for dealing with this will be necessary.

FIG. 16 is a block diagram of the resistance variation detection circuit 1 according to an 11th example adapted to solve this problem. This arrangement is such that in the resistance variation detection circuit 1 according to the seventh example shown in FIG. 11, the first current source circuit 4 is connected to ground via the electro-static discharge protection circuit 31 and first resistor 2 (external resistor) instead of being connected to ground via the series connection between the diode 10 and first resistor 2 (external resistor); the point at which the first resistor 2 (external resistor) is connected to the electro-static discharge protection circuit 31 is connected to the input terminal of a voltage follower circuit 11 via another electro-static discharge protection circuit 31; and the output terminal of the voltage follower circuit 11 is connected to the third current source circuit 6 and to the first input terminal 13 of the voltage comparator circuit 8.

If we let $I_{ref} = I_{ref2}$ hold as a readily understandable example, a voltage the same as that at the terminal 15, namely $I_{ref2} \times R = I_{ref} \times R$, will appear at the input/output of the voltage follower, i.e., on the cathode side of the diode 10. The potential at the anode of the diode 10 becomes $I_{ref} \times R + Vf$, which is the result of adding the forward voltage Vf of the diode 10 to above-mentioned voltage. This is the same as the anode potential of the diode in the arrangement of FIG. 11. Accordingly, actions and effects similar to those of the arrangement shown in FIG. 11 can be obtained with the arrangement of FIG. 16 as well. In addition, with the arrangement of FIG. 16, electro-static discharge protection is realized with regard to the terminal 15 to which the external resistor is connected.

It should be noted that even in a case where $I_{ref}$ and $I_{ref2}$ are set to different values in this arrangement, functions and effects similar to those of the arrangement of FIG. 11 can be realized by suitably adjusting the value of R. Further, in this arrangement, it goes without saying that similar functions and effects can be realized even if the position of the external resistor and the position of the diode are interchanged.

12th EXAMPLE

FIG. 17 is a block diagram of the resistance variation detection circuit 1 according to a 12th example of the present invention. The arrangement of FIG. 17 differs from that of the resistance variation detection circuit 1 of FIG. 16 described as the 11th example in that instead of controlling the current that flows from the second current source circuit 5 into the internal second resistor 3 by the current-source control signal, the current that flows from the first current source circuit 4 into the external first resistor 2 and the current that flows from the third current source circuit 6 into the diode 10 are controlled by the current-source control signal. That is, with the resistance variation detection circuit 1 of FIG. 16 described as the 11th example, the currents that flow into the diode and external resistor (first resistor 2) are fixed values and the current that flows into internal resistor (second resistor 3) is controlled by the current-source control signal. On the other hand, with the resistance variation detection circuit 1 of FIG. 17, the currents that flow into the diode 10 and external resistor (first resistor 2) are controlled and the current that flows into the resistor R1 is a fixed value. Accordingly, functions and effects equivalent to those described in the 11th example can be obtained by adopting an arrangement in which the value of the current that flows from the third current source circuit 6 into the diode 10 and the value of the current that flows from the first current source circuit 4 into the external resistor (first resistor 2) are controlled by a common n-bit current-source control signal and current-value control switches 32, 33 while the proportional relationship is maintained. Further, in this arrangement, it goes without saying that similar functions and effects can be realized even if the position of the external resistor (first resistor 2) and the position of the diode 10 are interchanged.

13th EXAMPLE

FIG. 18 is a block diagram of the resistance variation detection circuit 1 according to a 13th example of the present invention. The resistance variation detection circuit 1 of the 13th example will be described with reference to FIG. 18. This arrangement also is a circuit in which the problem of the arrangement of FIG. 15 is solved. The third current source circuit 6 is connected to the diode 10, the first current source circuit 4 is connected to the external resistor (first resistor 2), the voltages generated in the respective elements are added by the voltage adding circuit 12 and the output thereof is connected to the voltage comparator circuit 8. If we let $I_{ref}=I_{ref2}$ hold as a readily understandable example, a voltage $I_{ref} \times R$ will appear at the external resistor (first resistor 2) and therefore a voltage $I_{ref} \times R + Vf$ will appear at the output of the voltage adding circuit 12. This is the same as the anode potential of the diode 10 in the arrangement of FIG. 11. Accordingly, actions and effects similar to those of the arrangement shown in FIG. 11 can be obtained with the arrangement of FIG. 18 as well. In addition, with the arrangement of FIG. 18, electro-static discharge protection is realized with regard to the terminal to which the external resistor (first resistor 2) is connected. That is, in a manner similar to that shown in FIGS. 3, 16 and 17, a electro-static discharge protection circuit can be provided between the first current source circuit 4 and the common node of the first current source circuit 4 and voltage adding circuit 12, and another electro-static discharge protection circuit can be provided between this common node and the voltage adding circuit 12, although these protection circuits are not shown in FIG. 18.

It should be noted that even in a case where $I_{ref}$ and $I_{ref2}$ are set to different values in this arrangement, functions and effects similar to those of the arrangement of FIG. 11 can be realized by suitably adjusting the resistance value R of the external first resistor 2.

Further, even in a case where the voltage adding circuit 12 possesses a gain other than 1, functions and effects similar to those of the arrangement of FIG. 11 can be realized by suitably adjusting the resistance value R, the size of the diode 10 and $I_{ref}$, $I_{ref2}$.

14th EXAMPLE

FIG. 19 is a block diagram of the resistance variation detection circuit 1 according to a 14th example of the present invention. The arrangement of FIG. 19 is a more concrete implementation of the 13th example shown in FIG. 18. Specifically, a network comprising five operational amplifiers and resistors is used as the voltage adding circuit 12. This circuit is such that the node potentials of the first resistor 2 and diode 10 are buffered by voltage-follower-connected operational amplifiers 41, 42 connected to respective ones of these nodes, the outputs of these operational amplifiers are then inverted and amplified by operational amplifiers 50, 51, respectively, and the outputs of these operational amplifiers are added, accompanied by inversion, by one more operational amplifier 52. By virtue of this operation, the voltages generated in the respective elements are added.

15th EXAMPLE

FIG. 20 is a block diagram of the resistance variation detection circuit 1 according to a 15th example of the present invention. This arrangement is such that in the resistance variation detection circuit 1 of FIG. 18 described as the 13th example, the second current source circuit 5 that supplies current to the internal second resistor 3 is fixed, and the first current source circuit 4 that supplies current to the external first resistor 2 and third current source circuit 6 that supplies current to the diode 10 are controlled in terms of amount of current by the n-bit current control signal that is output by the control circuit 9.

By virtue of this arrangement, functions and effects equivalent to those described in the 13th example can be obtained by adopting an arrangement in which the value of the current that flows from the first current source circuit 4 into the external resistor (first resistor 2) and the value of the current that flows from the third current source circuit 6 into the diode 10 are controlled by a common n-bit current-source control signal and current-value control switches 32, 33 while the proportional relationship is maintained.

16th EXAMPLE

Figure 21:
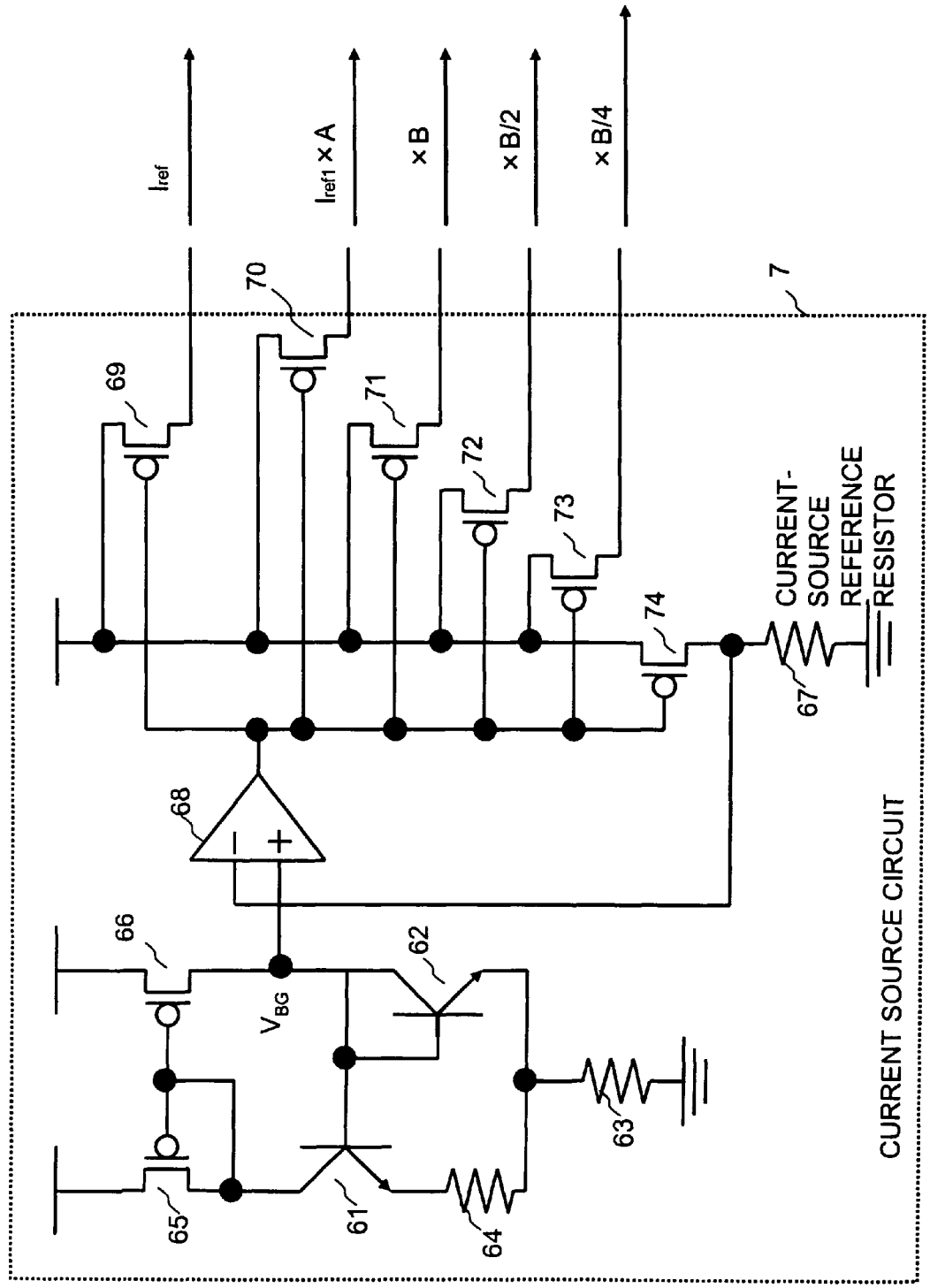
FIG. 21 is a block diagram illustrating a current source circuit of a resistance variation detection circuit according to a 16th example of the present invention.

FIG. 21 is a block diagram illustrating a current source circuit 7 in the resistance variation detection circuit 1 according to a 16th example of the present invention. The arrangement of the current source circuit 7 in FIG. 21 illustrates a circuit arrangement more detailed than shown for the first current source circuit 4 and second current source circuit 5 of depicted in FIGS. 1, 3, 5 and 9 to 15. This arrangement is such that a band-gap voltage $V_{BG}$ is generated by a band-gap circuit on the left side that includes bipolar transistors 61, 62, PMOS transistors 65, 66 and resistors 63, 64, and gate voltage of a PMOS transistor 74 is subjected to feedback control in such a manner that the voltage $V_{BG}$ and a voltage generated in a current-source reference resistor 67 will come into balance. The necessary current sources such as the current $I_{ref}$ and currents $I_{ref1} \times A$, $I_{ref1} \times B$, $I_{ref1} \times B/2$, etc., of the first current source circuit 4 and second current source circuit 5 are obtained by a current mirror circuit (PMOS transistors 69 to 74) in which the current that flows into the current-source reference resistor 67 serves as the reference.

In this arrangement, it goes without saying that it is possible for the first to third current source circuits 4 to 6 included in FIGS. 16 to 20 to be implemented by adding on a PMOS transistor that will serve as the current output transistor of the current mirror circuit.

17th EXAMPLE

FIG. 22 is a block diagram illustrating the resistance variation detection circuit 1 according to a 17th example of the present invention. In this arrangement, the current source circuit 7 of FIG. 21 described as the 16th example is used as the first and second current source circuits 4 and 5 of the resistance variation detection circuit 1 of FIG. 11 described as the seventh example, and the current-source reference resistor 67 of the current source circuit 7 shown in FIG. 21 is made to serve also as the external first resistor 2. It goes without saying that actions and advantages similar to those mentioned in the seventh example are obtained with this arrangement as well.

18th EXAMPLE

FIG. 23 is a block diagram illustrating the resistance variation detection circuit 1 according to a 18th example of the present invention. In this arrangement, the position of the serially connected network comprising the external resistor (first resistor 2) and diode 10 and the position of the internal resistor R1 of the integrated circuit in the resistance variation detection circuit 1 of FIG. 22 described as the 17th example are interchanged. It goes without saying that similar actions and advantages are obtained with this arrangement as well.

In accordance with each of the foregoing examples, a resistance variation detection circuit for acquiring the variation of a resistor as digital data can be constructed. Further, by adopting an arrangement in which a plurality of binarily weighted current sources are provided and these are selected by switches and added, a resistance variation detection circuit of small circuit area and high precision can be constructed. Furthermore, it is possible to detect the extent to which the actual temperature dependency curve of the resistance value of a resistor has been shifted, by variation due to manufacture, with respect to the temperature dependency curve of the resistance value of the resistance element in a case where variation is zero.

It should be noted that although only one of the first or second current source circuit 4, 5 in the foregoing examples undergoes digital adjustment of the amount of current supplied, both of the first and second current source circuits 4, 5 may be subjected to control of the amount of current supplied and the resistance variation may be found by combining such control.

Though the present invention has been described in accordance with the foregoing examples, the invention is not limited to these examples and it goes without saying that the invention covers various modifications and changes that would be obvious to those skilled in the art within the scope of the claims.

The present invention is capable of being used widely in the field of electronic circuits that employ resistors. In particular, by incorporating the resistance variation detection circuit according to the present invention in a semiconductor integrated circuit internally incorporating an analog circuit that uses resistors, a variation in resistance value used in the semiconductor integrated circuit itself can be self-evaluated. This makes it possible to perform an operation that compensates for a variation in resistance value. Accordingly, it is possible to enhance the performance and quality of a semiconductor integrated circuit and to improve yield.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A resistance variation detection circuit comprising:
   a first resistor;
   a second resistor;
   a first current source circuit that supplies said first resistor with current;
   a second current source circuit that supplies said second resistor with current;
   a voltage comparator circuit that compares a voltage across said first resistor and a voltage across said second resistor; and
   a control circuit that digitally adjusts a supply current of at least one of said first or second current source circuit,
   wherein a ratio of resistance values of said first and second resistors can be obtained from an adjustment value from said control circuit and a result of comparison from said voltage comparator circuit.

2. The circuit according to claim 1, wherein said control circuit reads in a result of the comparison performed by said voltage comparator circuit, adjusts a current supply amount based upon the result of the comparison and outputs a final detection result as digital data.

3. The circuit according to claim 1, wherein said first and second current source circuits comprise a current source circuit in which either said first resistor or said second resistor serves as a current-source reference resistor.

4. The circuit according to claim 1, wherein:
   said first resistor comprises a single resistor, and
   said second resistor comprises a single resistor.

5. The circuit according to claim 1, wherein one of said first resistor and said second resistor comprises an external resistor.

6. The circuit according to claim 5, further comprising a terminal connected between an input of said voltage comparator circuit and said external resistor.

7. The circuit according to claim 5, wherein all circuit elements, except said external resistor, are formed on a single semiconductor substrate.

8. The circuit according to claim 1, wherein said second current source circuit comprises a plurality of current sources.

9. The circuit according to claim 8, wherein currents produced by said plurality of current sources are controlled by a plurality of switch transistors.

10. The circuit according to claim 1, wherein said first and second resistors are connected to positive power-source nodes having a same potential and a current direction of said first and second current source circuits are opposite.

11. The circuit according to claim 1, wherein a terminal of said first resistor and a terminal of said second resistor are connected to ground.

12. The circuit according to claim 1, further comprising a temperature characteristic compensation element,
   wherein said voltage comparator circuit comprises a first input terminal and a second input terminal,
   a summed voltage of a voltage across said temperature characteristic compensation element and a voltage across said first resistor is input to said first input terminal, and
   a voltage across said second resistor is input to said second input terminal.

13. The circuit according to claim 1, further comprising a diode,
   wherein said voltage comparator circuit comprises a first input terminal and a second input terminal,
   a summed voltage of a voltage across said diode and a voltage across said first resistor is input to said first input terminal, and a voltage across said second resistor is input to said second input terminal.

14. The circuit according to claim 13, further comprising:
a third current source circuit, which is connected to a first end of said diode and to said first input terminal of said voltage comparator circuit, for supplying said diode with current; and
a voltage follower circuit including an input connected to one end of said first resistor and an output connected to a second end of said diode.

15. The circuit according to claim 13, further comprising:
a third current source circuit that supplies said diode with current; and a voltage adding circuit that adds a voltage across said first resistor and a voltage across said diode,
wherein an output terminal of said voltage adding circuit is connected to said first input terminal of said voltage comparator circuit.

16. The circuit according to claim 13, wherein said diode is connected in series with said first resistor.

17. A semiconductor device having a resistance variation detection function includes a semiconductor substrate on which the resistance variation detection circuit is formed, set forth in claim 1, with the exception of either one of said first and second resistors, and comprises a terminal for one resistor.

* * * * *